United States Patent
Mizutani et al.

(10) Patent No.: US 6,346,363 B2
(45) Date of Patent: Feb. 12, 2002

(54) POSITIVE PHOTORESIST COMPOSITION

(75) Inventors: Kazuyoshi Mizutani; Shoichiro Yasunami, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/729,178

(22) Filed: Dec. 5, 2000

(30) Foreign Application Priority Data

Dec. 6, 1999 (JP) ............................................ 11-346316
Dec. 14, 1999 (JP) ............................................ 11-354710

(51) Int. Cl.$^7$ .............................................. G03F 7/004
(52) U.S. Cl. ..................................... 430/270.1; 522/148
(58) Field of Search ........................... 430/270.1, 272.1; 522/148

(56) References Cited

U.S. PATENT DOCUMENTS 5,972,560 A * 10/1999 Kaneko et al. ........... 430/270.1
6,066,433 A *  5/2000 Takemura et al. ........ 430/270.1
6,296,985 B1 * 10/2001 Mizutani et al. ......... 430/270.1

FOREIGN PATENT DOCUMENTS

JP         9-274319    10/1997    ........... G03F/7/039
JP         2736939      1/1998    ........... C08G/77/04

* cited by examiner

Primary Examiner—Rosemary Ashton
(74) Attorney, Agent, or Firm—Sughrue Mion, PLLC

(57) ABSTRACT

A positive type photoresist composition comprising an alkali-soluble or acid-decomposable polysiloxane containing repeating structural units represented by formula (I):

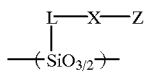

(I)

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

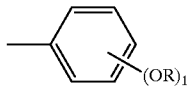

or a group represented by

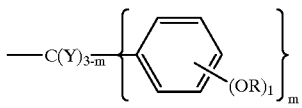

wherein Y represents a hydrogen atom, an alkyl group, an aryl group or an aralkyl group, an atomic group represented by Y may be straight-chain, branched or cyclic, R represents a hydrogen atom or an acid-decomposable group, l represents an integer of from 1 to 3, and m also represents an integer of from 1 to 3.

16 Claims, No Drawings

POSITIVE PHOTORESIST COMPOSITION

FIELD OF THE INVENTION

The present invention relates to a positive (type) photoresist composition used for the production of semiconductor integrated circuit elements, mask for producing integrated circuits, printed wiring boards and liquid crystal panels.

BACKGROUND OF THE INVENTION

As pattern forming methods for producing electronic parts such as semiconductor elements (i.e., semiconductor device) magnetic bubble memories and integrated circuits, methods utilizing photoresists sensitive to ultraviolet rays or visible rays have hitherto been widely made practicable. The photoresists include negative type photoresists in which irradiated portions are insolubilized in developing solutions by light irradiation, and positive type photoresists in which irradiated portions are conversely solubilized in developing solutions. The negative type photoresists are higher in sensitivity than the positive ones, and excellent in adhesion with substrates and chemical resistance which are required for wet etching, so that the negative type photoresists have occupied the main stream of photoresists until recently.

However, with increased density and integration of semiconductor elements, the line width and the distance have become extremely small, and dry etching has come to be employed for etching of substrates. Accordingly, high resolution and high dry etching resistance have become to be desired for photoresists. At present, the photoresists have been mostly occupied by the positive type photoresists. Of the positive type photoresists, for example, alkali development type positive photoresists based on alkali-soluble novolak resins described in J. C. Strieter, *Kodak Microelectronics Seminar Proceedings*, 116 (1976) have been mainly used in the current processes, because of their excellent sensitivity, resolution and dry etching resistance.

However, with recent multifunctionalization and advancement of electronic equipments, it has been strongly demanded that patterns are made fine for further increasing the density and the integration.

That is to say, the longitudinal dimension of integrated circuits has not been decreased so much, compared with a reduction in the transverse dimension thereof, so that the ratio of the height to the width of resist patterns can not help increasing. For this reason, with advance of making patterns fine, it has become more difficult to suppress changes in the size of resist patterns on wafers having complicated differences in level.

Further, also in various kinds of exposure systems, problems have arisen, associated with a reduction in the minimum dimension. For example, in light-exposure, the interference action of reflected light based on the differences in level of substrates has exerted a great influence on the dimensional accuracy, whereas in electron beam-exposure, the proximity effect generated by the back scattering of electrons have made it impossible to increase the ratio of the height to the width of the fine resist patterns.

It has been found that these many problems are solved by the use of the multilayer resist system. As to the multilayer resist systems, the outline thereof is given in *Solid State Technology*, 74 (1981). In addition to this, many studies of this system have been presented.

In general, the multilayer resist methods include a three-layer resist method and a two-layer resist method. The three-layer method is a method of forming a flattened organic film on a substrate having differences in level, overlaying an intermediate inorganic layer and a resist thereon, patterning the resist, then dry etching the intermediate inorganic layer using the patterned resist as a mask, and further patterning the flattened organic film using the intermediate inorganic layer as a mask by O2RIE (reactive ion etching). In this method, basically, conventional techniques can be used, so that studies have been initiated early. However, the problem is encountered that the process is very complicated, or that three layers of the organic layer, the inorganic layer and the organic layer different from one another in properties are overlaid with one another, so that cracks and pin holes are liable to generate in the intermediate layer.

In contrast with the three-layer resist method, the two-layer resist method uses a resist combining properties of both the resist and the intermediate inorganic layer used in the three-layer resist method, that is to say, a resist having oxygen plasma resistance. Accordingly, the generation of cracks and pinholes is inhibited, and the process is simplified from three layers to two layers. However, although a conventional resist can be used as the upper-layer resist in the three-layer resist method, the two-layer resist method has the problem that a resist having oxygen plasma resistance must be newly developed.

From the above-described background, the development of positive type photoresists being able to be used as the upper-layer resist in the two-layer resist method, excellent in oxygen plasma resistance, and high in sensitivity and resolution, particularly resists of the alkali development system which can be used without changing the present process has been desired.

In contrast, there are proposed light-sensitive compositions in which alkali solubility-imparted polysiloxanes or silicone polymers such as polysilylmethylene are combined with conventional orthoquinonediazide light-sensitive materials, for example, light-sensitive compositions described in JP-A-61-144639 (the term "JP-A" as used herein means an "unexamined published Japanese patent application", JP-A-61-256347, JP-A-62-159141, JP-A-62-191849, JP-A-62-220949, JP-A-62-229136, JP-A-63-90534, JP-A-63-91654 and U.S. Pat. No. 4,722,881, and further light-sensitive compositions described in JP-A-62-136638, in which effective amounts of onium compounds are combined with polysiloxane/carbonate block copolymers.

However, to any of these silicone polymers, the alkali solubility is given by introduction of phenolic OH groups or silanol groups ($\equiv$Si—OH). When the alkali solubility is given by introduction of phenolic OH groups, the production thereof becomes significantly difficult. When the alkali solubility is given by introduction of silanol groups, there is the problem that the aging stability is not necessarily good, or that the film reduction after development is increased, resulting in failure to obtain rectangularity.

Further, Japanese Patent No. 2736939 and JP-A-9-274319 disclose photoresists containing polysiloxanes having groups decomposable by the action of acids in their molecules. However, these photoresists have the problems that the resolution is low, that rectangularity is not obtained, and that the dimension shift of pattern is increased in pattern transfer to the lower layers in the subsequent oxygen plasma process.

SUMMARY OF THE INVENTION

An object of the present invention is to provide a positive type photoresist composition high in sensitivity in the production of a semiconductor device, having a resolution as high as 0.2 μm or less, and giving a photoresist pattern having rectangularity.

Another object of the present invention is to provide a positive type photoresist composition decreased in dimension shift of pattern in pattern transfer to the lower layer in the oxygen plasma etching process, when it is used as an upper-layer resist in the two-layer resist system.

A further object of the present invention is to provide a polysiloxane which can give the above-described excellent characteristics to a positive type photoresist composition.

According to the present invention, the following polysiloxane and positive type photoresist composition are provided, thereby attaining the above-described objects of the present invention:

(1) A positive (type) photoresist composition comprising an alkali-soluble or acid-decomposable polysiloxane containing repeating structural units represented by formula

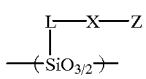

(I)

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

or a group represented by

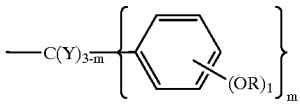

wherein Y represents a hydrogen atom, an alkyl group, an aryl group or an aralkyl group, an atomic group represented by Y may be straight-chain, branched or cyclic, R represents a hydrogen atom or an acid-decomposable group, 1 represents an integer of from 1 to 3, and m also represents an integer of from 1 to 3;

(2) The positive (type) photoresist composition described in (1), which comprises an alkali-soluble or acid-decomposable polysiloxane further containing repeating structural units represented by formula (II) together with the units represented by formula (I):

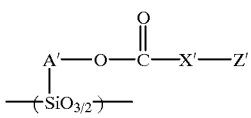

(II)

wherein A', X' and Z' each has the same meaning as given for each of A, X and Z in formula (I);

(3) The positive (type) photoresist composition described in (1), which comprises an alkali-soluble polysiloxane wherein R contained in the group represented by Z in formula (I) is a hydrogen atom;

(4) The positive (type) photoresist composition described in (2), which comprises an alkali-soluble polysiloxane wherein R contained in the group represented by Z' in formula (II) is a hydrogen atom;

(5) The positive (type) photoresist composition described in (2), wherein A' is —(CH$_2$)$_n$— in formula (II);

(6) The positive (type) photoresist composition described in (1), wherein L is —(CH$_2$)$_3$—NHCO— in formula (I);

(7) The positive (type) photoresist composition described in (3), which further contains a phenolic compound in which at least a part of phenolic hydroxyl groups contained in a molecule are partially or completely protected by acid-decomposable groups;

(8) The positive (type) photoresist composition described in (3), which further contains an aromatic or aliphatic carboxylic acid compound in which at least a part of carboxyl groups contained in a molecule are partially or completely protected by acid-decomposable groups;

(9) A positive (type) photoresist composition comprising the following (a), (b), (c) and (d):

(a) an alkali-soluble or acid-decomposable polysiloxane containing repeating structural units represented by formula (I):

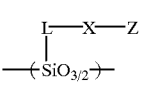

(I)

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

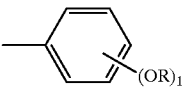

or a group represented by

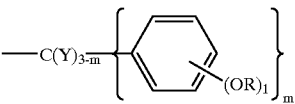

wherein Y represents a hydrogen atom, an alkyl group, an aryl group or an aralkyl group, an atomic group represented by Y may be straight-chain, branched or cyclic, R represents a hydrogen atom or an acid-decomposable group, 1 represents an integer of from 1 to 3, and m also represents an integer of from 1 to 3;

(b) a compound which is decomposed by exposure to generate an acid;

(c) (c1) a phenolic compound in which at least a part of phenolic hydroxyl groups contained in a molecule are partially or completely protected by acid-decomposable groups, or (c2) an aromatic or aliphatic carboxylic acid compound in which at least a part of carboxyl groups contained in a molecule are partially or completely protected by acid-decomposable groups; and
(d) a solvent which can dissolve all of the above (a), (b) and (c);
(10) The positive (type) photoresist composition described in (9), which comprises an alkali-soluble or acid-decomposable polysiloxane further containing repeating structural units represented by formula (II) together with the units represented by formula (I):

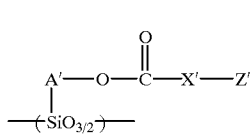
(II)

wherein A', X' and Z' each has the same meaning as given for each of A, X and Z in formula (I);
(11) The positive (type) photoresist composition described in (10), wherein A' is —$(CH_2)_n$— in formula (II);
(12) The positive (type) photoresist composition described in (9), wherein L is —$(CH_2)_3$—NHCO— in formula (I);
(13) A positive (type) photoresist composition comprising the following (a), (b) and (d):
(a) an alkali-soluble or acid-decomposable polysiloxane containing repeating structural units represented by formula (I):

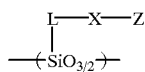
(I)

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

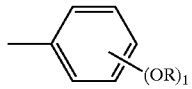

or a group represented by

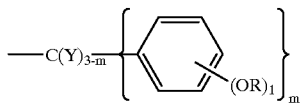

wherein Y represents a hydrogen atom, an alkyl group, an aryl group or an aralkyl group, an atomic group represented by Y may be straight-chain, branched or cyclic, R represents a hydrogen atom or an acid-decomposable group, provided that at least a part of repeating units in the polysiloxane is a repeating unit in which R is an acid-decomposable group, 1 represents an integer of from 1 to 3, and m also represents an integer of from 1 to 3;

(b) a compound which is decomposed by exposure to generate an acid; and
(d) a solvent which can dissolve both of the above (a) and (b);
(14) The positive (type) photoresist composition described in (13), which comprises an acid-decomposable polysiloxane further containing repeating structural units represented by formula (II) together with the units represented by formula (I):

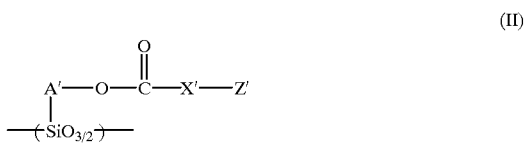
(II)

wherein A', X' and Z' each has the same meaning as given for each of A, X and Z in formula (I);
(15) The positive type photoresist composition described in (14), wherein A' is —$(CH_2)_n$— in formula (II); and
(16) The positive type photoresist composition described in (13), wherein L is —$(CH_2)_3$—NHCO— in formula (I).

DETAILED DESCRIPTION OF THE INVENTION

First, the polysiloxanes used in the positive type photoresist compositions of the present invention will be described.

In formula (I), L represents —A—NHCO—, —A—NHCOO— or —A—NHCONH—. Preferred is —A—NHCO— among these.

A in formula (I) and A' in formula (II) each represents a single bond, an alkylene group or an arylene group. Of these, preferred is an alkylene group having 1 to 6 carbon atoms or a phenylene group, and more preferred is a propylene group. X in formula (I) and X' in formula (II) each represents a single bond or a divalent connecting group. Specific examples of the divalent connecting groups include a straight-chain alkylene group having from 1 to 6 carbon atoms, a branched alkylene group having from 1 to 6 carbon atoms, an alicyclic group having from 6 to 10 carbon atoms, an aromatic ring group having from 6 to 10 carbon atoms, an aralkylene group having from 7 to 11 carbon atoms, an ether group, a thioether group, a carbonyl group, an ester group, an amido group, a sulfonamido group, a urethane group, a urea group and sulfone group. They may be used alone or as a combination of two or more of them. Preferred is a single bond or an alkylene group having from 1 to 6 carbon atoms, and more preferred is a straight-chain alkylene group having from 1 to 6 carbon atoms. Z in formula (I) and Z' in formula (II) each represents either a group represented by

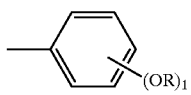

or a group represented by

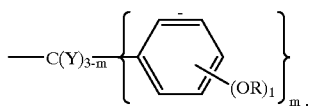

R is a hydrogen atom or an acid-decomposable group.

In the —OR group in Z, R may form an ester group together with an oxygen atom to which R is directly joined, thereby constituting the acid-decomposable group. R may partly contain an acid-decomposable atomic group, thereby constituting the acid-decomposable group.

Preferred examples of the alkylene groups include methylene, ethylene, propylene and butylene, and preferred examples of the alicyclic groups include cyclohexylene and norbornene. Preferred examples of the aromatic ring groups include phenylene and naphthylene, and preferred examples of the aralkylene groups include phenylenemethylene.

Y represents a hydrogen atom, an alkyl group, an aryl group or an aralkyl group. The alkyl group may be straight-chain, branched or cyclic. The alkyl group has preferably from 1 to 10 carbon atoms, the aryl group has preferably from 6 to 10 carbon atoms, and the aralkyl group has preferably from 7 to 11 carbon atoms.

Specifically, Y represents hydrogen, methyl, ethyl, n-propyl, i-propyl, n-butyl, i-butyl, t-butyl, n-pentyl, i-pentyl, n-hexyl, cyclohexyl, phenyl, naphthyl, benzyl, phenethyl or naphthylmethyl. Hydrogen and methyl are preferred among these.

L represents an integer of from 1 to 3, preferably 1 or 2, and m represents an integer of from 1 to 3, preferably 1 or 2. The acid-decomposable groups indicated by R in the acid-decomposable polysiloxanes represented by formula (I) include a group indicated by —$CR^1R^2$ ($OR^3$), methoxymethyl, ethoxymethyl, t-butyl, t-amyl, 1-methylcyclohexyl, trimethylsilyl and t-butyldimethylsilyl. $R^1$ and $R^2$, which may be the same or different, each represents a hydrogen atom or a straight-chain or branched alkyl group having from 1 to 6 carbon atoms, and $R^3$ represents a straight-chain, branched or cyclic alkyl group having from 1 to 10 carbon atoms. Further, $R^2$ and $R^3$ may combine with each other to form a ring structure, preferably a 6-membered ring structure.

Preferred examples of the acid-decomposable groups include t-butyl, trimethylsilyl, t-butyldimethylsilyl, ethoxymethyl and groups represented by the following formulas:

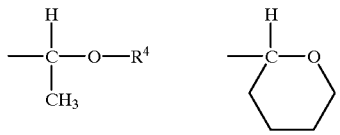

wherein $R^4$ represents methyl, ethyl, n-propyl, i-propyl, n-butyl, i-butyl or t-butyl.

The acid-decomposable groups of the acid-decomposable polysiloxanes represented by formula (II) include a group indicated by —$CR^5R^6$($OR^7$) t-butoxycarbonyl, t-butoxycarbonylmethyl, t-butyl, t-amyl, 1-methylcyclohexyl, trimethylsilyl and t-butyldimethylsilyl. $R^5$ and $R^6$, which may be the same or different, each represents a hydrogen atom or a straight-chain or branched alkyl group having from 1 to 6 carbon atoms, and $R^7$ represents a straight-chain, branched or cyclic alkyl group having from 1 to 10 carbon atoms. Further, $R^6$ and $R^7$ may combine with each other to form a ring structure, preferably a 6-membered ring structure.

Preferred examples of the acid-decomposable groups include t-butoxycarbonyl, t-butyl, trimethylsilyl, t-butyldimethylsilyl and groups represented by the following formulas:

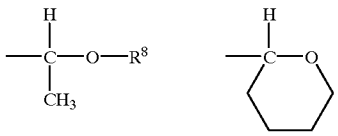

wherein $R^8$ represents methyl, ethyl, n-propyl, i-propyl, n-butyl, i-butyl or t-butyl.

The acid-decomposable polysiloxane of the present invention contains structures of formulas (I) and (II) together preferably in an amount of 20 to 100 mol %, more preferably 40 to 100 mol %. The (I) (II) content ratio is desirably from 80/20 to 20/80.

In the acid-decomposable polysiloxane of the present invention, the ratio of phenolic OH protected with the acid decomposable group is from 10 to 90 mol %, preferably from 20 to 80 mol %, and more preferably from 40 to 75 mol %. In this case, the term "mol %" means, taking as 100% the total of phenolic structural units contained in the polysiloxane and structural units converted to phenolic OH groups by decomposition with the acid, mol % of the structural units converted to the phenolic OH groups by decomposition with the acid, which are occupied therein.

In the acid-decomposable polysiloxane of the present invention, structural units represented by the following formula (III) and/or (IV) may be copolycondensed for controlling the solvent solubility and the alkali solubility.

wherein W, $W^1$ and $W^2$ each represents a group having no alkali solubility or no acid decomposability. Specifically, it represents a straight-chain alkyl group having from 1 to 10 carbon atoms which may have a substituent, a branched alkyl group having from 3 to 10 carbon atoms which may have a substituent, a cyclic alkyl group having from 6 to 10 carbon atoms which may have a substituent, an aryl group having from 6 to 10 carbon atoms which may have a substituent, or an aralkyl group having from 7 to 11 carbon atoms which may have a substituent. Preferred examples of these groups include methyl, ethyl, n-propyl, i-propyl, n-butyl, i-butyl, t-butyl, n-pentyl, n-hexyl, n-heptyl, n-octyl, n-nonyl, n-decyl, cyclohexyl, phenyl, naphthyl, benzyl and naphthylmethyl.

The substituents for these groups include a halogen atom, an alkoxy group having from 1 to 6 carbon atoms, a phenoxy group and a hydroxyl group.

$W^1$ and $W^2$ may be the same or different.

The acid-decomposable polysiloxane having the structural units represented by the above-described formula (I) or (II) can be obtained by synthesizing an alkali-soluble polysiloxane having phenolic structures at ends thereof, followed by protection of the OH groups with the acid-decomposable groups.

The alkali-soluble polysiloxane being an intermediate, can be synthesized by amide connecting a carboxylic acid compound having a phenol structure to a mono-substituted trialkoxysilane having an amino group at an end thereof by the DCC method or the mixed acid anhydride method to transform the phenol structure to the trialkoxysilane structure, and then optionally adding a mono-substituted trialkoxysilane or a di-substituted trialkoxysilane for giving the structural units represented by the above-described formula (III) or (IV), followed by polycondensation in the presence of water and an acidic catalyst, or water and a basic catalyst.

For allowing the reaction to proceed in high yield, a carboxylic acid compound having a phenol structure in which the OH group is previously protected may be amide connected to a mono-substituted trialkoxysilane having an amino group at an end thereof by the DCC method or the mixed acid anhydride method to transform the phenol structure to the trialkoxysilane structure, and then the protected group is deprotected, followed by polycondensation in the presence of water and an acidic catalyst, or water and a basic catalyst, or subsequently to the amidation, the polycondensation may be conducted in the presence of water and an acidic catalyst, or water and a basic catalyst, followed by deprotection.

As the protecting groups for OH, there can be used t-butoxycarbonyl (BOC), acetyl, alkoxy, benzyloxycarbonyl (Z) and trialkylsilyl.

Then, for the resulting alkali-soluble polysiloxane, the OH group thereof is protected by the acid-decomposable group.

For introducing the above-described acid-decomposable group, well-known reactions such as an acidic catalyst reaction with a vinyl ether compound corresponding to the acid-decomposable group and an basic catalyst reaction with di-t-butyl dicarbonate, trimethylsilyl chloride or t-butyldimethylsilyl chloride can be used.

The use of siloxane units having the structural units represented by the above-described formula (III) of (IV) is preferred in terms of the solvent solubility, the sensitivity, the resolution and the rectangularity of patterns.

Specific examples of the structural units of the polysiloxanes, that is to say, the acid-decomposable polysiloxanes, of the present invention are shown below, but the present invention is not limited thereto.

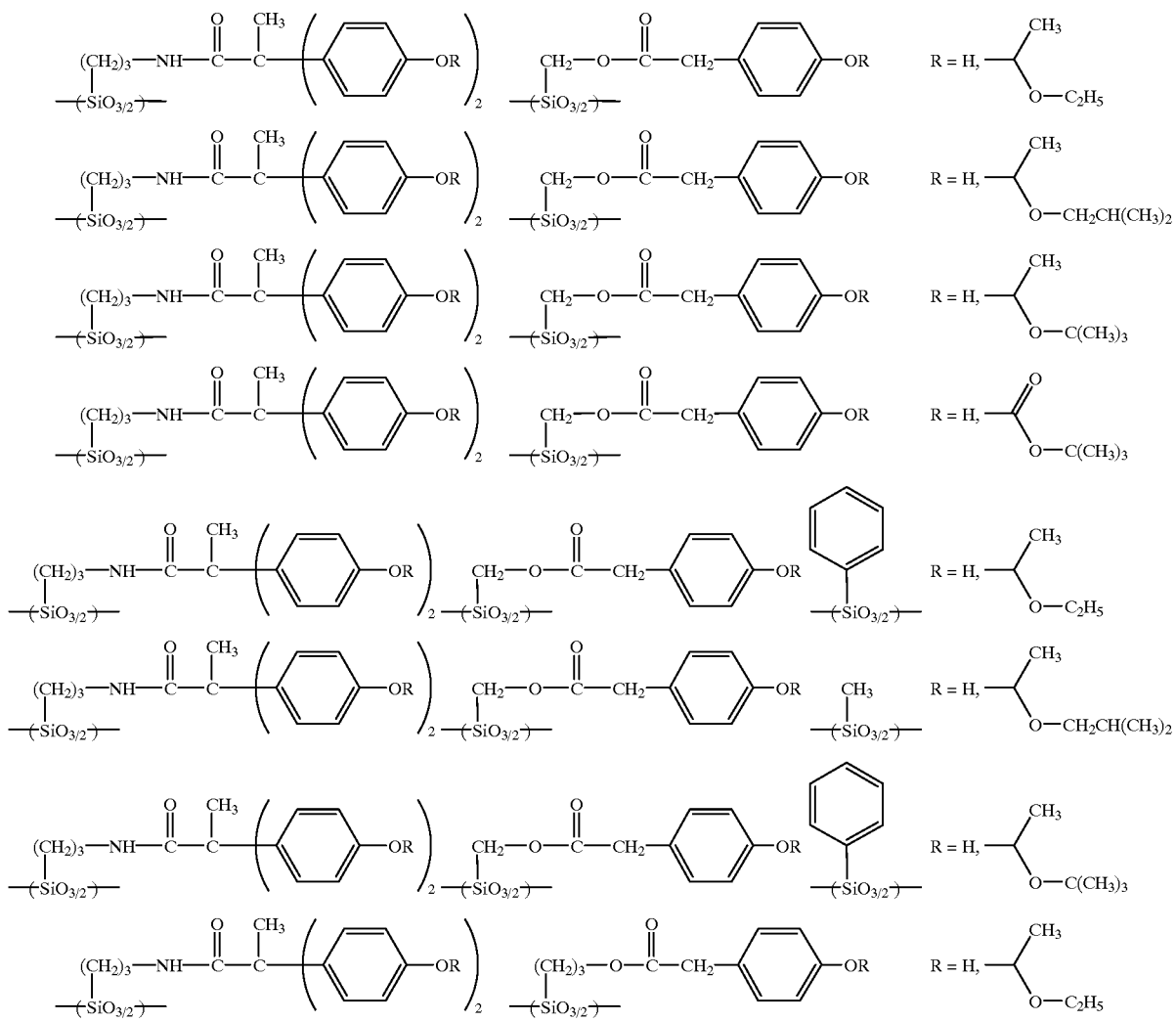

-continued
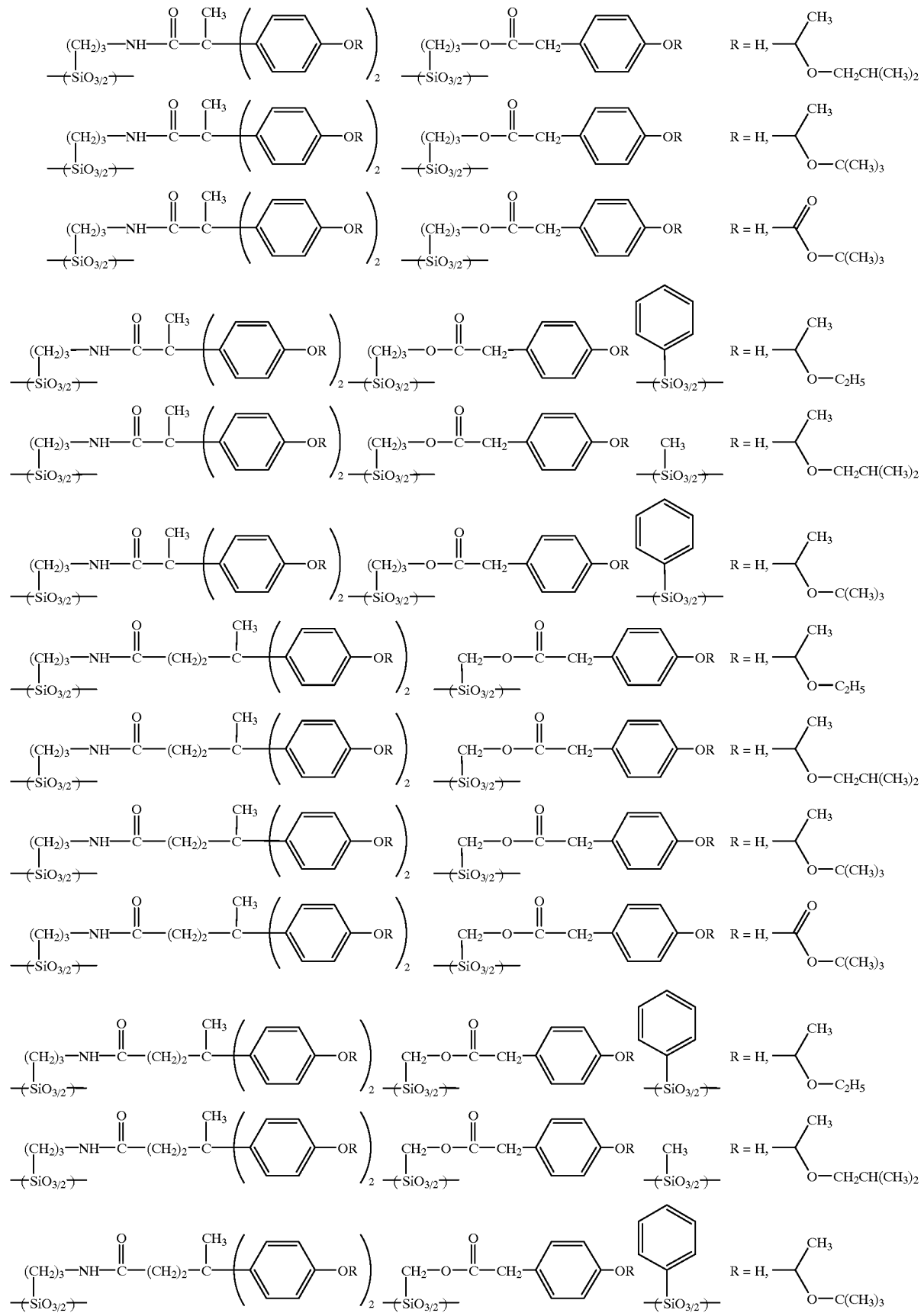

-continued
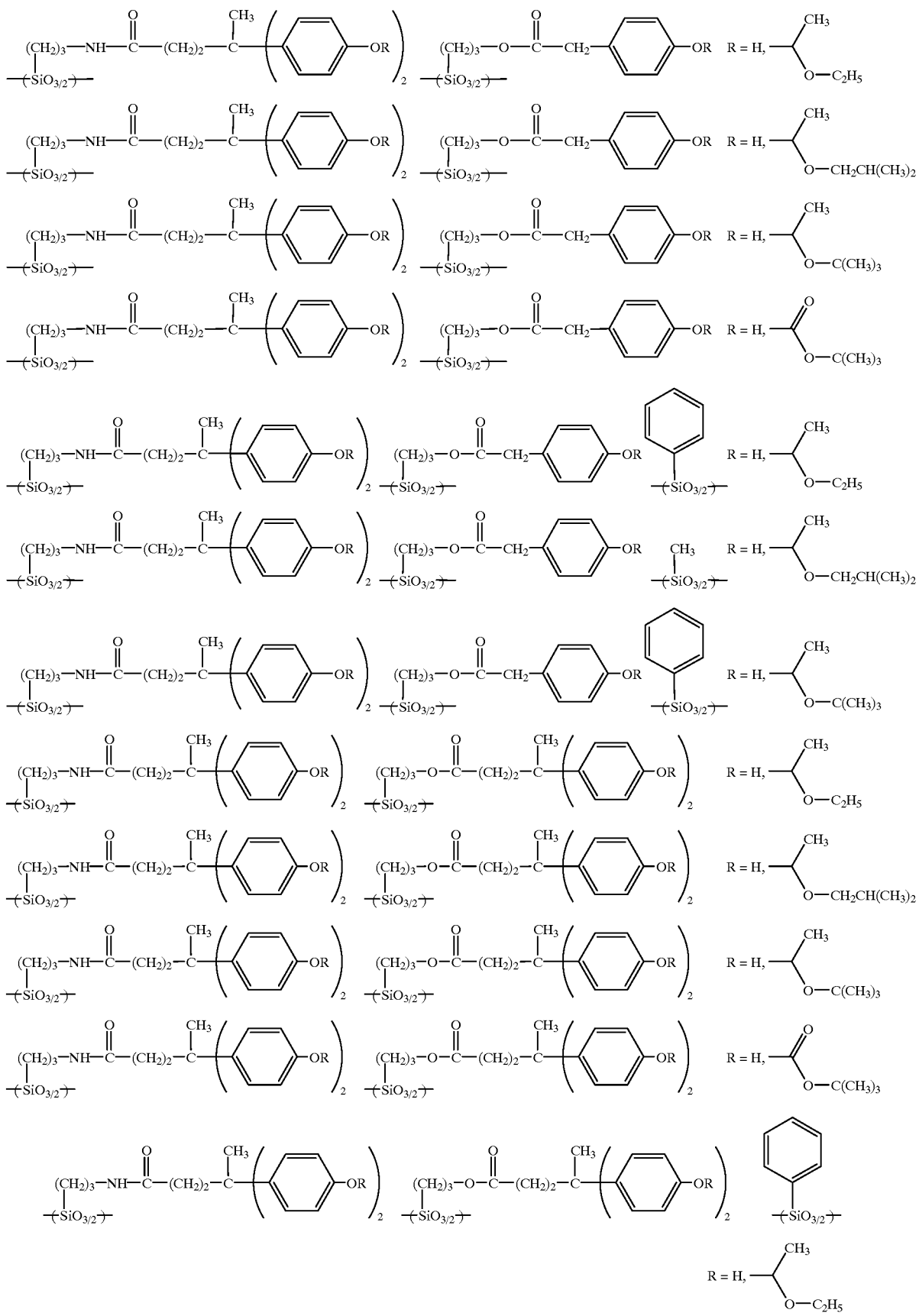

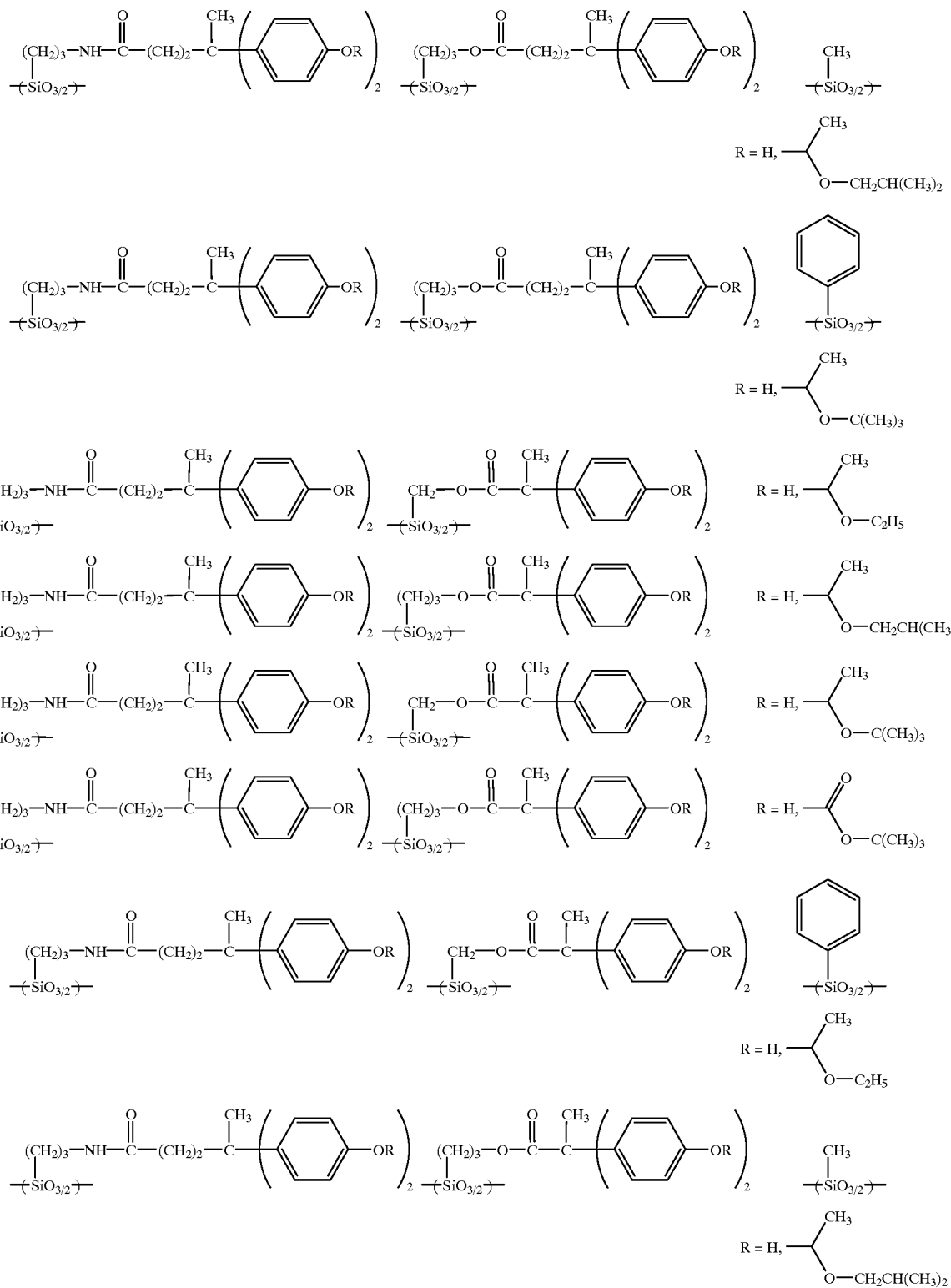

-continued
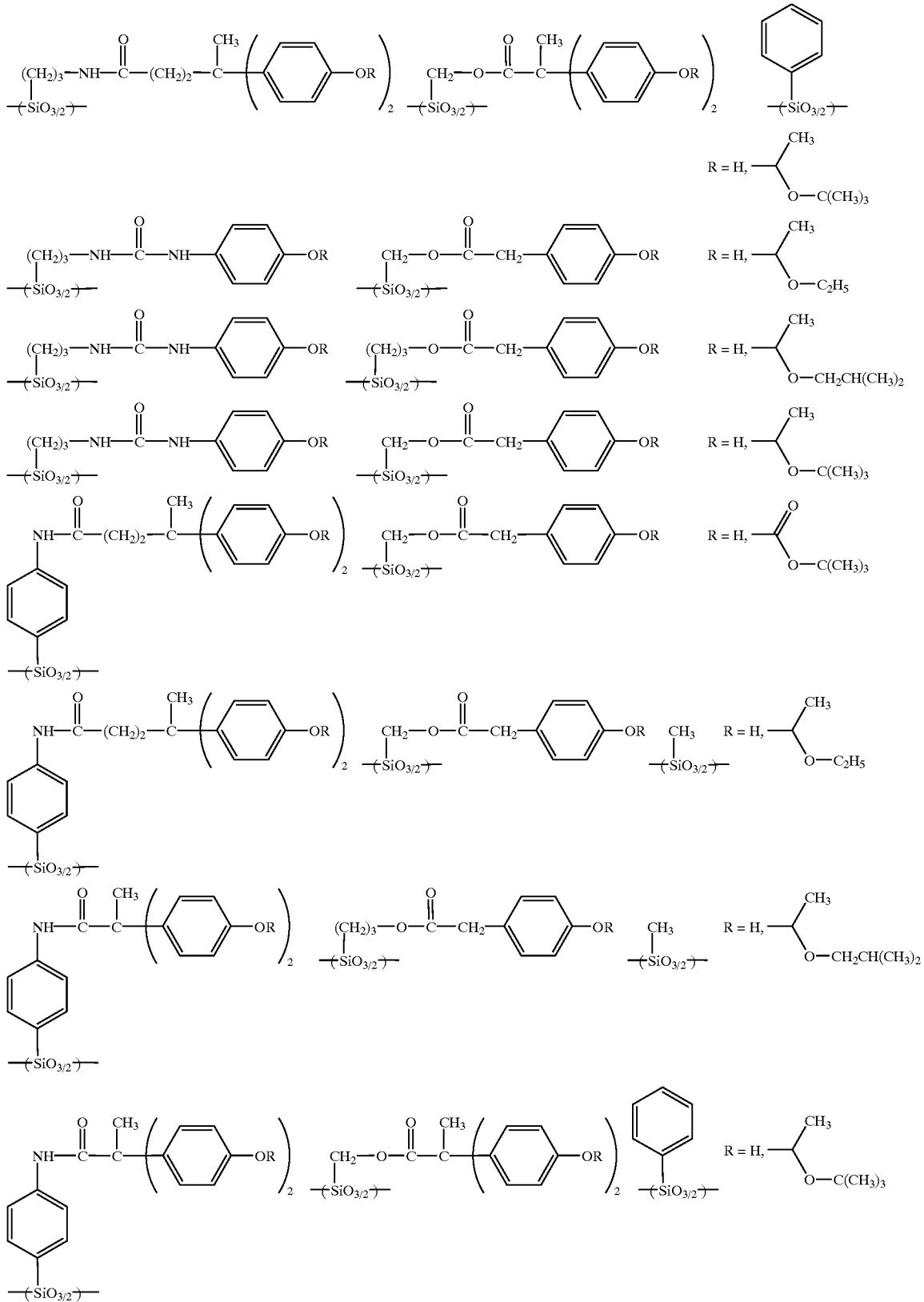
As the polysiloxanes used in the positive-type photoresist compositions of the present invention, the alkali-soluble polysiloxanes containing the repeating units represented by formula (I) are preferably used also. That is to say, the alkali-soluble polysiloxanes is preferably used in which R in Z in the repeating unit represented by formula (I) is a hydrogen atom.

Details thereof will be described below.

In formula (I), L represents at least one divalent connecting group selected from the group consisting of —A—NHCO—, —A—NHCOO— or —A—NHCONH—. A represents an alkylene group or an arylene group. Of these, preferred is an alkylene group having from 1 to 6 carbon atoms or a phenylene group, and more preferred is a propylene group.

When L is —A—NHCO—, —A—NHCOO— or —A—NHCONH—, the hydrogen bond enhaces the heat resistance of the polysiloxane, thereby giving high resolution and moreover patterns of the rectangularity. When A is indicated by a propylene group herein, not only the desired polysiloxane is obtained from an inexpensive raw material, 3-aminopropyltrialkoxysilane, but also the silicon content of the polysiloxane can be preferably maintained at a high level.

X in formula (I) and X' in formula (II) each represents a single bond or a divalent connecting group. Specific examples thereof include a single bond, an alkylene group, a substituted alkylene group, an ether group, a thioether group, a carbonyl group, an ester group, an amido group, a sulfonamido group, a urethane group and a urea group. They may be used alone or as a combination of two or more of them. Preferred is a single bond or an alkylene group, and more preferred is a single bond or an alkylene group having from 1 to 6 carbon atoms. Z in formula (I) and Z' in formula (II) each represents a monovalent group selected from the group consisting of groups represented by

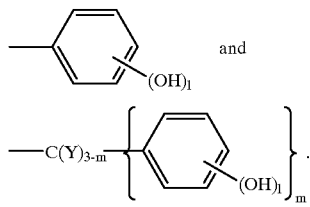

Y represents a hydrogen atom, an alkyl group, an aryl group or an aralkyl group. When Y is an atomic group, it may be straight-chain, branched or cyclic. Preferably, Y is a hydrogen atom or a straight-chain, branched or cyclic alkyl group having from 1 to 6 carbon atoms. 1 represents an integer of from 1 to 3, and m represents an integer of from 1 to 3.

This provides a resist composition not only increased in solubility in a general-purpose ester or alcohol solvent, but also enhanced in the compatibility of a photoacid generating agent with the polysiloxane and showing high resolution.

The alkali-soluble polysiloxane of the present invention contain structural units represented by formula (I) preferably in an amount of 10 to 100 mol %, more preferably 30 to 100 mol %.

In the polysiloxane containing structural units represented by formula (I) and structural units represented by formula (II) together, the total amount of the structural units of formulas (I) and (II) contained is preferably from 20 to 100 mol %, and more preferably from 50 to 100 mol %

The (I)/(II) content ratio is desirably from 80/20 to 40/60.

In the alkali-soluble polysiloxane of the present invention, structural units represented by the following formula (III) and/or (IV) may be further copolymerized for controlling the solvent solubility and the alkali solubility.

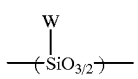

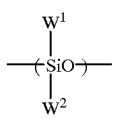

wherein W, $W^1$ and $W^2$ each represents a group having no alkali solubility or no acid decomposability, and specifically, represents an alkyl group, an aryl group or an aralkyl group. The alkyl groups include a straight-chain alkyl group having from 1 to 10 carbon atoms, a branched alkyl group having from 3 to 10 carbon atoms, and a cyclic alkyl group having from 6 to 10 carbon atoms. In all cases, the alkyl groups may have or not have substituents. The aryl groups include an aryl group having from 6 to 10 carbon atoms, and the aralkyl groups include an aralkyl group having from 7 to 11 carbon atoms. Both the aryl groups and the aralkyl groups may have or not have substituents.

Preferred examples of these groups include methyl, ethyl, n-propyl, i-propyl, n-butyl, i-butyl, t-butyl, n-pentyl, n-hexyl, n-heptyl, n-octyl, n-nonyl, n-decyl, cyclohexyl, phenyl, naphthyl, benzyl and naphthylmethyl.

The substituents for these groups include a halogen atom, an alkoxy group having from 1 to 6 carbon atoms, a phenoxy group and a hydroxyl group.

$W^1$ and $W^2$ may be the same or different. The alkali-soluble polysiloxane having the structural units represented by the above-described formula (I) can be obtained by amide connecting a carboxylic acid compound having a phenol structure to a mono-substituted trialkoxysilane having an amino group at an end thereof by the DCC method or the mixed acid anhydride method to transform the phenol structure to the trialkoxysilane structure, and then optionally adding a mono-substituted trialkoxysilane or a di-substituted trialkoxysilane for giving the structural units represented by the above-described formulas (II) to (IV), followed by polycondensation in the presence of water and an acidic catalyst, or water and a basic catalyst.

For allowing the reaction to proceed in high yield, a carboxylic acid compound having a phenol structure in which the OH group is previously protected may be amide connected to a mono-substituted trialkoxysilane having an amino group at an end thereof by the DCC method or the mixed acid anhydride method to transform the phenol structure to the trialkoxysilane structure, and then the protected group is deprotected, followed by polycondensation in the presence of water and an acidic catalyst, or water and a basic catalyst, or subsequently to the amidation, the polycondensation may be conducted in the presence of water and an acidic catalyst, or water and a basic catalyst, followed by deprotection.

As the protecting groups for OH, there can be used t-butoxycarbonyl (BOC), acetyl, alkoxy, benzyloxycarbonyl (Z) and trialkylsilyl.

Specific examples of the structural units of the polysiloxanes are shown below, but the present invention is not limited thereto.

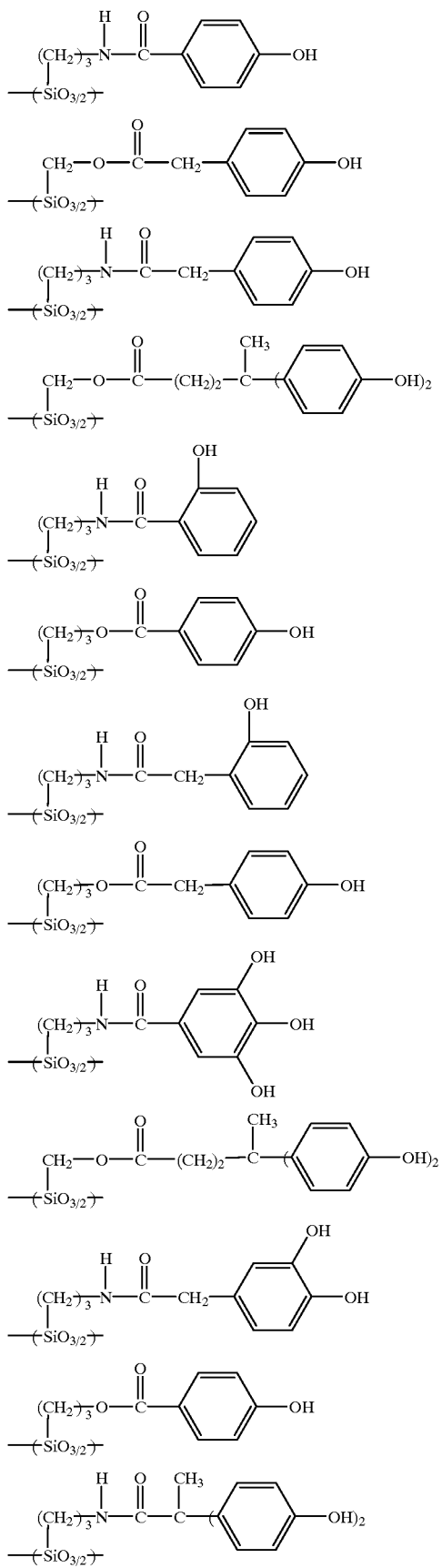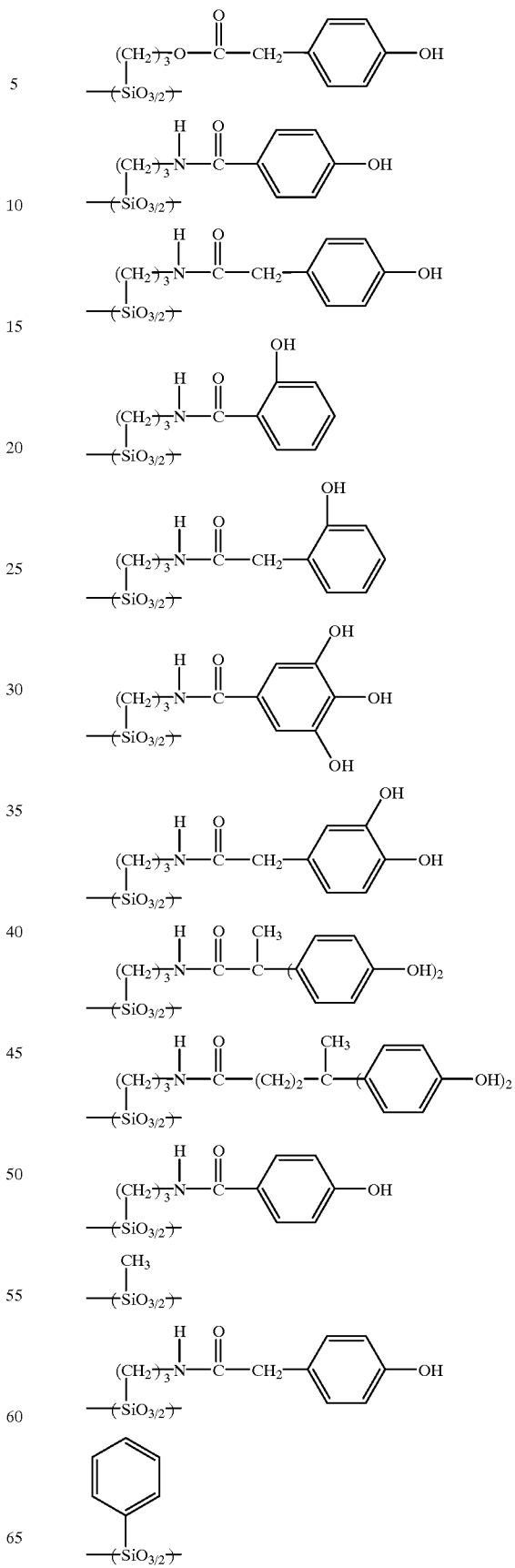

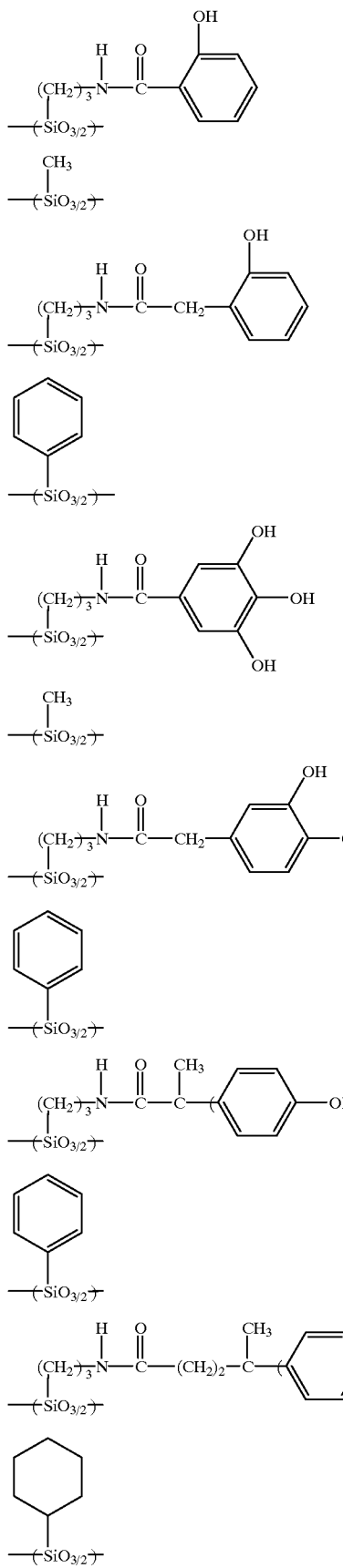
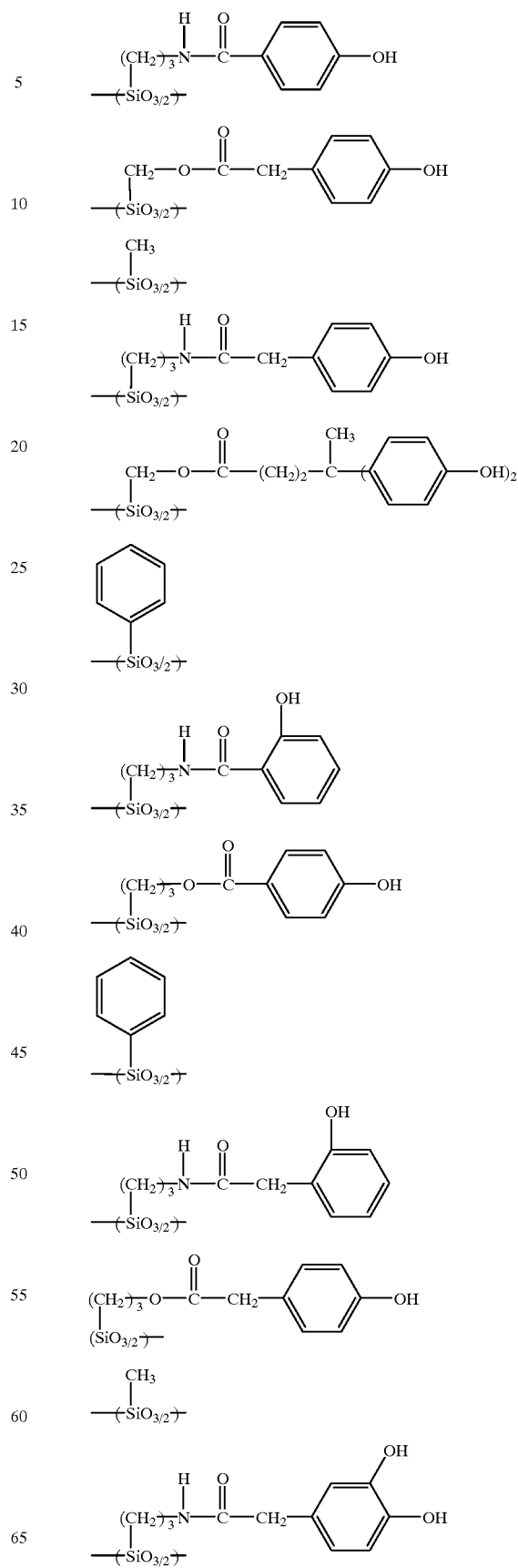

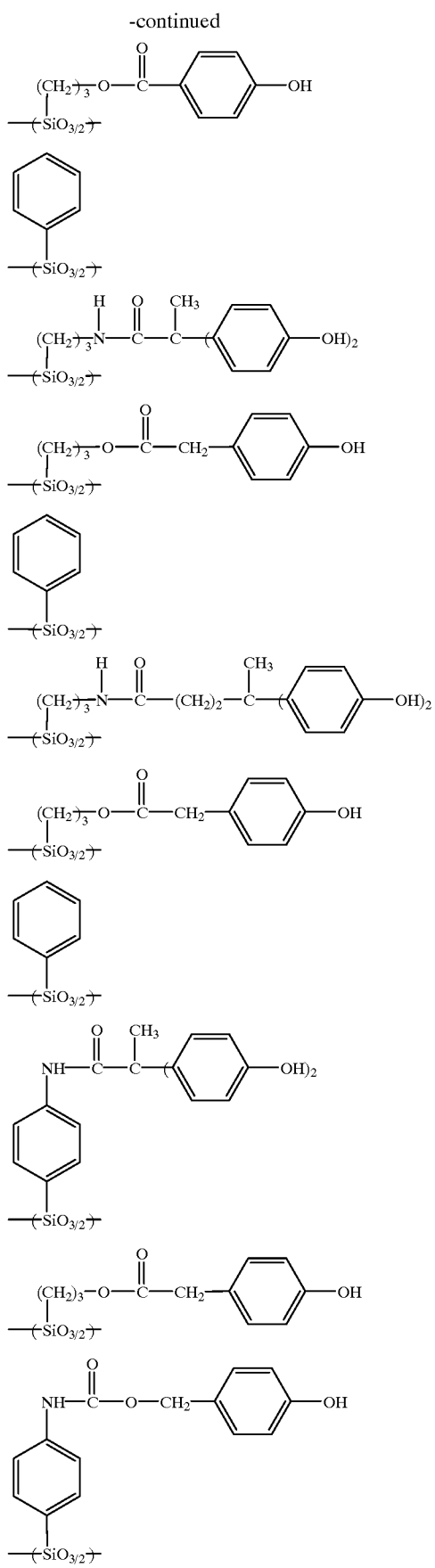
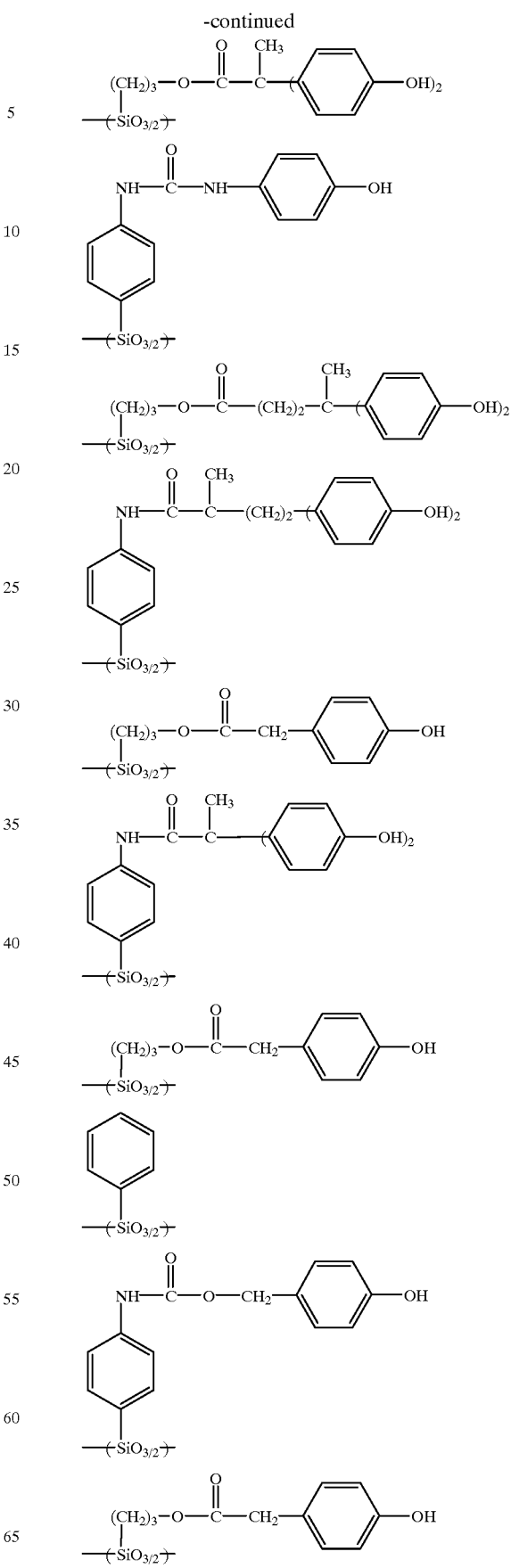

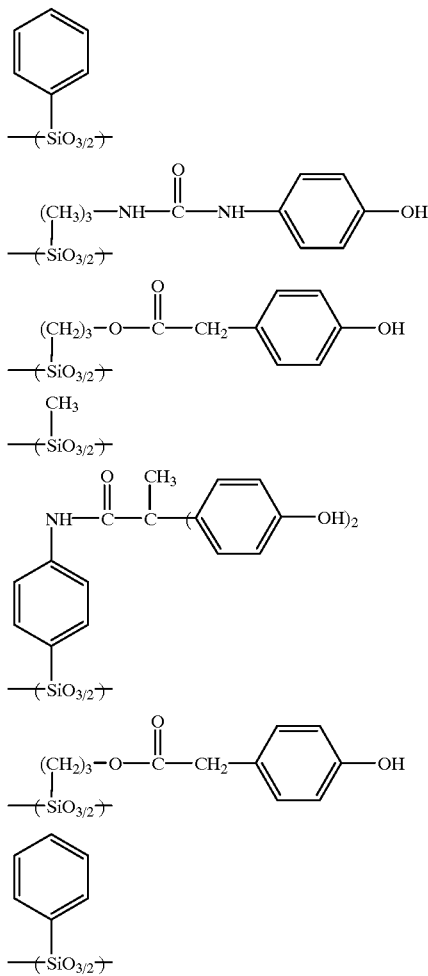

The weight average molecular weight of the polysiloxane of the present invention is preferably from 500 to 100000, more preferably from 700 to 50000, and still more preferably from 800 to 20000, yet still more preferably from 2000 to 20000, and most preferably from 4000 to 20000, as a polystyrene-converted value measured by gel permeation chromatography.

Then, the positive type photoresist compositions of the present invention will be described below.

One embodiment of the positive type photoresist compositions of the present invention has a composition comprising (a) the above-described alkali-soluble polysiloxane;

(b) a compound which is decomposed by exposure to generate an acid (photoacid generating agent);

(c) (c1) a phenolic compound in which at least a part of phenolic hydroxyl groups contained in a molecule are partially or completely protected by acid-decomposable groups, or (c2) an aromatic or aliphatic carboxylic acid compound in which at least a part of carboxyl groups contained in a molecule are partially or completely protected by acid-decomposable groups; and (d) a solvent which can dissolve all of the above (a), (b) and (c).

Another embodiment has a composition comprising (a) the above-described acid-decomposable polysiloxane;

(b) a compound which is decomposed by exposure to generate an acid (photoacid generating agent); and (d) a solvent which can dissolve both of the above (a) and (b).

In this case, the composition mat further contain (c) (c1) a phenolic compound in which at least a part of phenolic hydroxyl groups contained in a molecule are partially or completely protected by acid-decomposable groups, or (c2) an aromatic or aliphatic carboxylic acid compound in which at least a part of carboxyl groups contained in a molecule are partially or completely protected by acid-decomposable groups.

Further, the positive type photoresist composition of the present invention may preferably contain an alkali-soluble polysiloxane having the same structure as a structure in which the acid-decomposable groups of the acid-decomposable polysiloxane of the present invention are all dissociated by acid decomposition, and the content thereof is preferably from 5% to 50% by weight, and more preferably from 10% to 30% by weight, based on the composition.

The photoacid generating agent (b) used in the present invention is a compound generating an acid by irradiation of active light or radiation.

As the compounds used in the present invention which are decomposable by irradiation of active light or radiation to generate acids, there can be appropriately selected and used photoinitiators for cationic photopolymerization, photo-initiators for radical photopolymerization, photo-decolorizing agents and photodiscoloring agents for dyes, or compounds generating acids with well-known light used in microresists (ultraviolet rays of 400 nm to 200 nm, far ultraviolet rays, particularly preferably g-rays, h-rays, i-rays and KrF eximer laser beams), ArF eximer laser beams, electron beams, X-rays, molecular beams or ion beams, and mixtures thereof.

Examples of the other compounds used in the present invention which generate acids by irradiation of active light or radiation include, for example, onium salts such as diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069, 055, 4,069,056 and Re 27,992, and JP-A-3-140140, phosphonium salts described in D. C. Necker et al., *Macromolecules*, 17, 2468 (1984), C. S. Wen et al., *Teh. Proc. Conf. Rad. Curing ASIA*, p. 478, Tokyo, Oct. (1988), U.S. Pat. Nos. 4,069,055 and 4,069,056, iodonium salts described in J. V. Crivello et al., *Macromolecules*, 10 (6), 1307 (1977), *Chem. & Eng. News*, Nov. 28, 31 (1988), European Patent 104,143, 339,049 and 410,201, JP-A-2-150848 and JP-A-2-296514, sulfonium salts described in J. V. Crivello et al., *Polymer J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 161,811, 410,201, 339,049, 233, 567, 297,443 and 297,442, U.S. Pat. Nos. 3,902,114, 4,933, 377, 4,760,013, 4,734,444 and 2,833,827, German Patents 2,904,626, 3,604,580 and 3,604,581, JP-A-7-28237 and JP-A-8-27102, selenonium described in J. V. Crivello et al.,

*Macromolecules*, 10 (6), 1307 (1977) and J. V. Crivello et al., *J. Polymer Sci., Polymer Chem. Ed.*, 17, 1047 (1979) and arsonium salts described in C. S. Wen et al., *Teh. Proc. Conf. Rad. Curing ASIA*, p. 478, Tokyo, October (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896) and JP-A-2-161445; photoacid generating agents having o-nitrobenzyl type protecting groups described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc. Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0290,750, 046,083, 156,535, 271,851 and 0,388,343, U.S. Pat. Nos. 3,901,710 and 4,181,531, JP-A-60-198538 and JP-A-53-133022; compounds producing sulfonic acids by photolysis which are represented by iminosulfonates described in M. Tunooka et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37 (3), European Patents 0199,672, 84,515, 044,115, 618,564 and 0101,122, U.S. Pat. Nos. 4,371,605 and 4,431,774, JP-A-64-18143, JP-A-2-245756 and JP-A-3-140109; and disulfone compounds described in JP-A-61-166544 and JP-A-2-71270, and diazoketosulfone and diazodisulfone compounds described in JP-A-3-103854, JP-A-3-103856 and JP-A-4-210960.

Further, compounds in which these groups or compounds generating acids with light are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds generating acids with light can also be used, which are described in V. N. R. Pillai, *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

Of the above-described compounds which are decomposable by irradiation of active light or radiation to generate acids, compounds particularly effectively used are described below. These may be used in combination.

(1) Oxazole derivatives substituted by trihalomethyl groups, which are represented by the following formula (PAG1), or S-triazine derivatives represented by the following formula (PGA2):

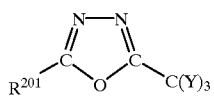
(PAG1)

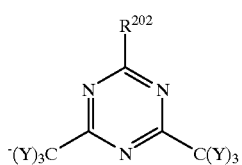
(PGA2)

wherein $R^{201}$ represents a substituted or unsubstituted aryl or alkenyl group; $R^{202}$ represents a substituted or unsubstituted aryl, alkenyl or alkyl group, or $-C(Y)_3$; and Y represents a chlorine atom or a bromine atom.

Specific examples thereof include but are not limited to the following compounds:

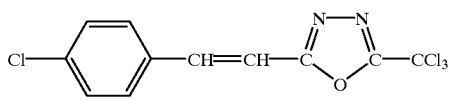
(PAG1-1)

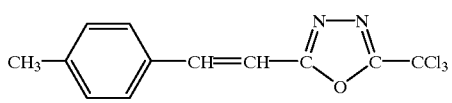
(PAG1-2)

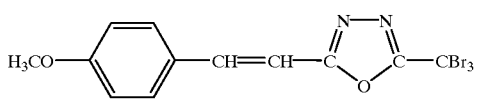
(PAG1-3)

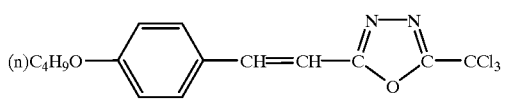
(PAG1-4)

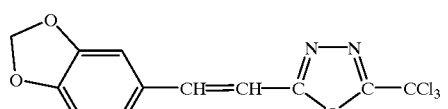
(PAG1-5)

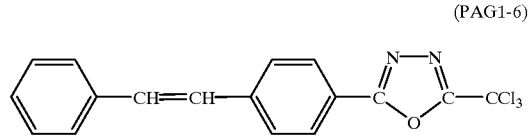
(PAG1-6)

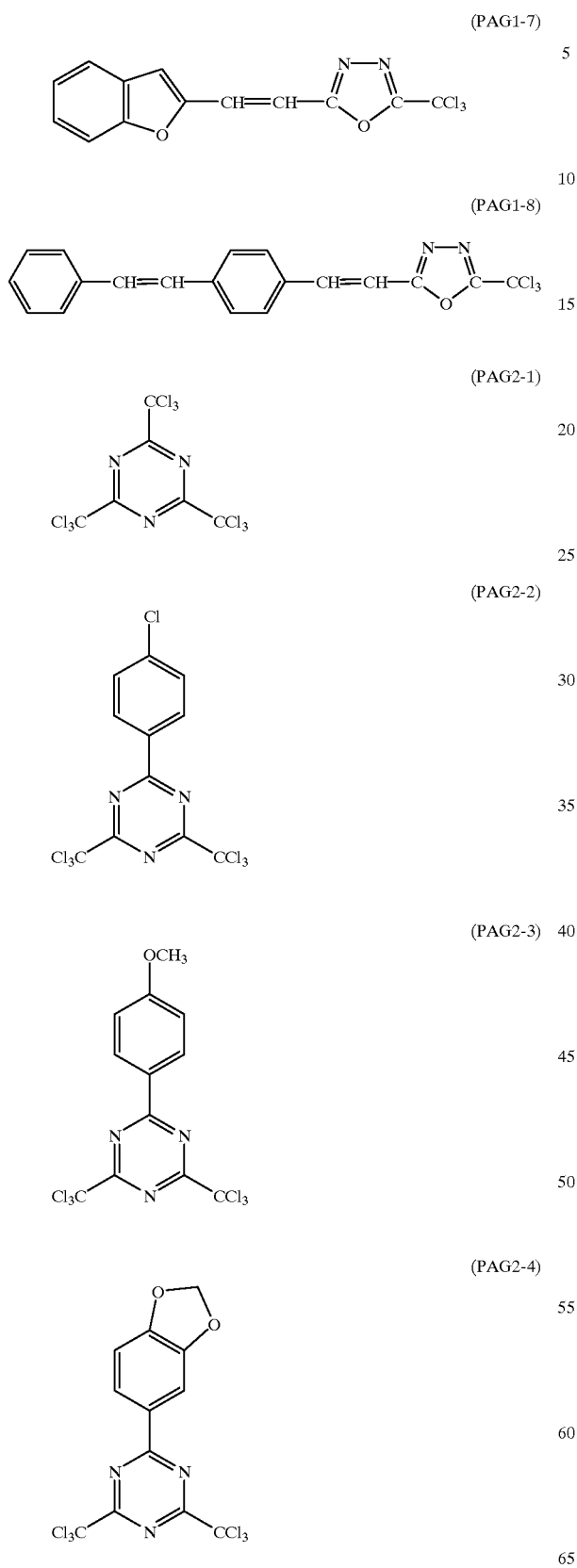
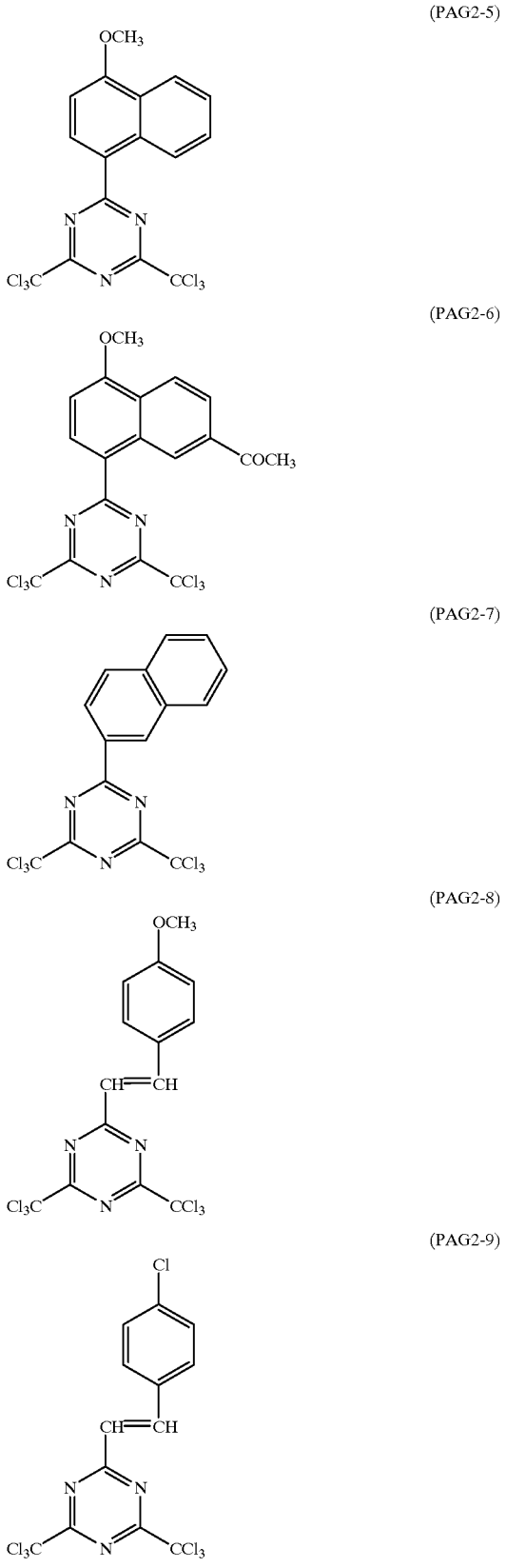

-continued (PAG2-10)
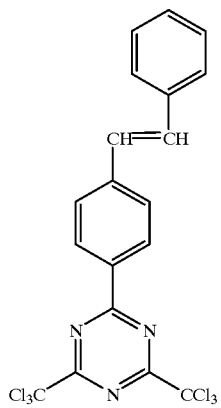

(2) Iodonium salts represented by the following formula (PAG3) or sulfonium salts represented by the following formula (PAG4):

(PAG3)
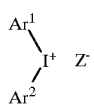

(PAG4)
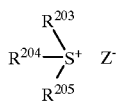

wherein $Ar^1$ and $Ar^2$ each independently represents a substituted or unsubstituted aryl group. Preferred examples of the substituents include alkyl, haloalkyl, cycloalkyl, aryl, alkoxy, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having 6 to 14 carbon atoms, an alkyl group having 1 to 8 carbon atoms or a substituted derivative thereof. Preferred examples of the substituents for aryl include alkoxy of 1 to 8 carbon atoms, alkyl of 1 to 8 carbon atoms, nitro, carboxyl, hydroxyl and halogen atoms, and preferred examples thereof for alkyl include alkoxy of 1 to 8 carbon atoms, carboxyl and alkoxycarbonyl.

$Z^-$ represents a counter ion, and examples thereof include $BF_4^-$, $AsF_6^-$, $PF_6^-$, $SbF_6^-$, $SiF_6^-$, $ClO_4^-$, perfluoroalkanesulfonic acid anions such as $CF_3SO_3^-$, pentafluorobenzenesulfonic acid anions, condensed polynuclear aromatic sulfonic acid anions such as naphthalene-1-sulfonic acid anions, anthraquinonesulfonic acid anions and sulfonic acid group-containing dyes, but are not limited to them.

Two of $R^{203}$, $R^{204}$ and $R^{205}$, and $Ar_1$ and $Ar_2$ may each combine together through each single bond or substituent.

Specific examples thereof include but are not limited to the following compounds:

(PAG3-1)
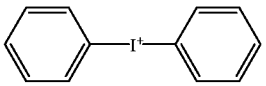

(PAG3-2)
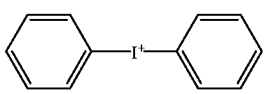

(PAG3-3)
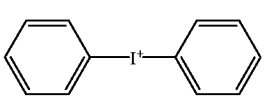

(PAG3-4)

(PAG3-5)
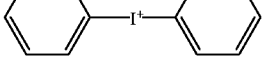

(PAG3-6)
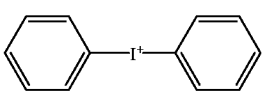

(PAG3-7)
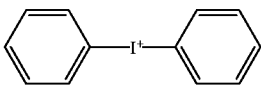

(PAG3-8)
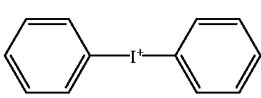

(PAG3-9)

(PAG3-10)
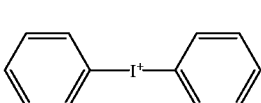

(PAG3-11)
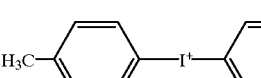

(PAG3-12)
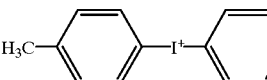

(PAG3-13)

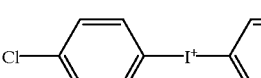

-continued
(PAG3-14)
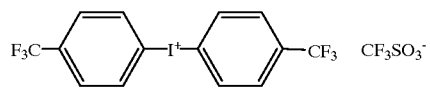
(PAG3-15)
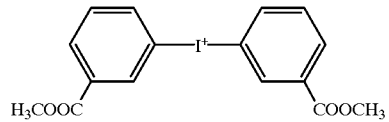
(PAG3-16)
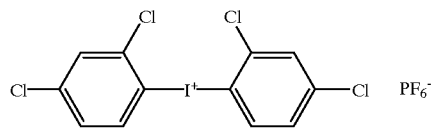
(PAG3-17)
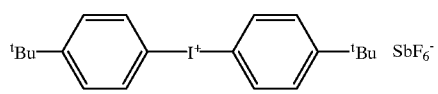
(PAG3-18)
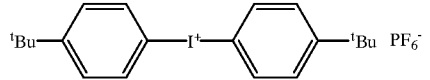
(PAG3-19)
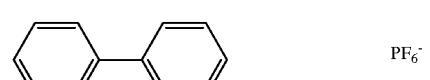
(PAG3-20)
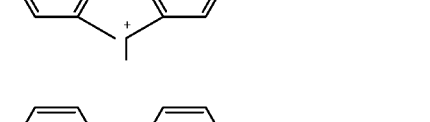
(PAG3-21)
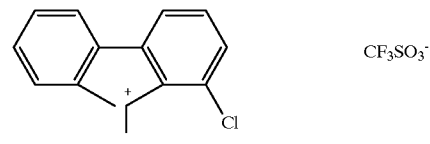
(PAG3-22)
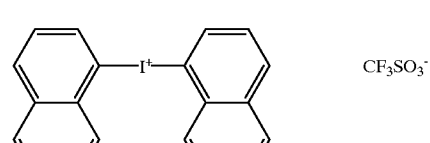
(PAG3-23)
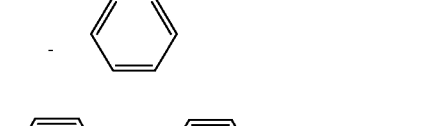
-continued
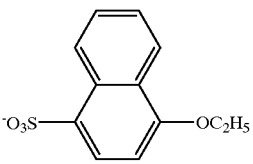
(PAG3-24)
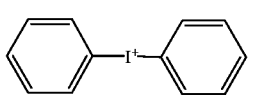
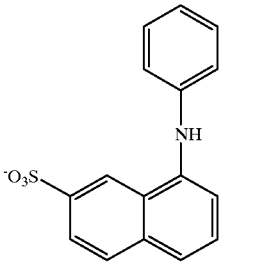
(PAG3-25)
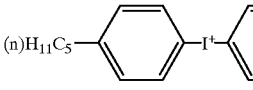
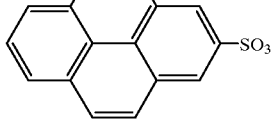
(PAG3-26)
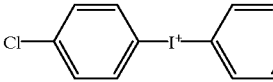
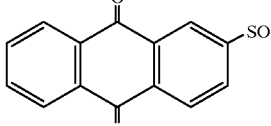
(PAG3-27)
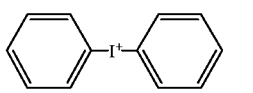
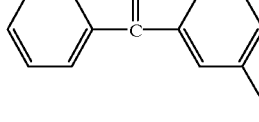
(PAG3-28)
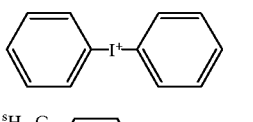
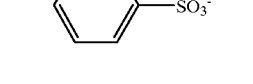

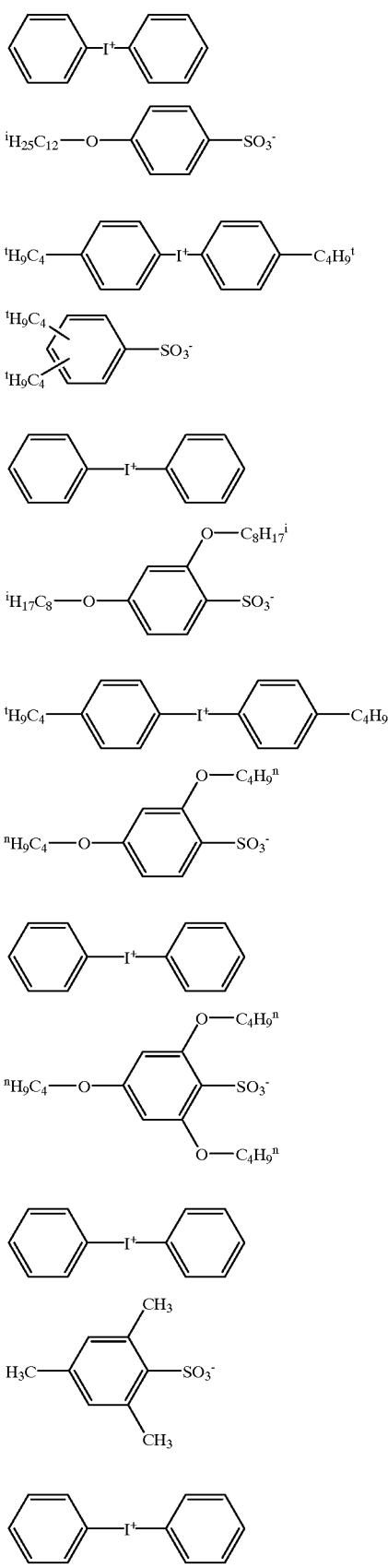

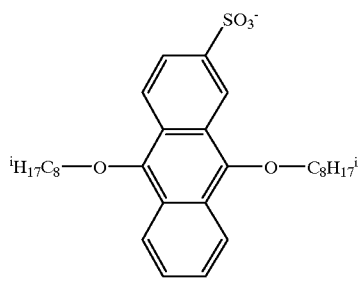
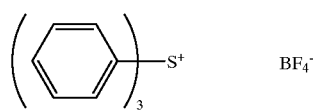
(PAG4-1)
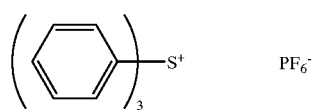
(PAG4-2)
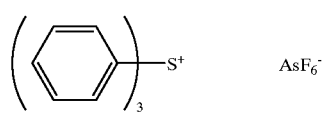
(PAG4-3)
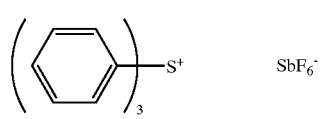
(PAG4-4)
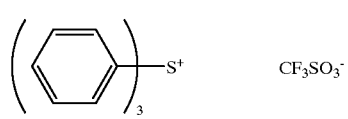
(PAG4-5)
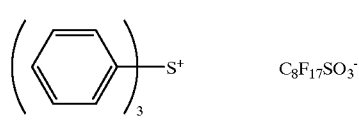
(PAG4-6)
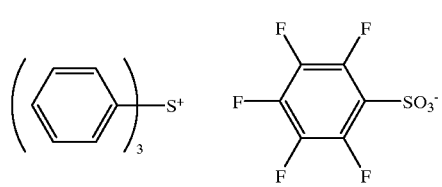
(PAG4-7)
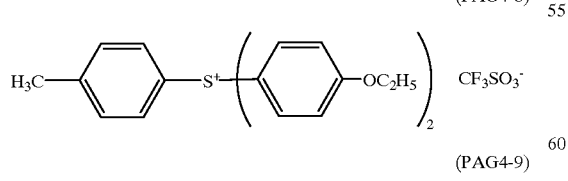
(PAG4-8)
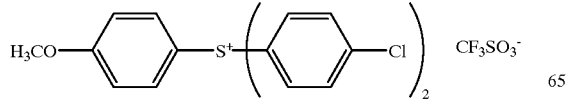
(PAG4-9)
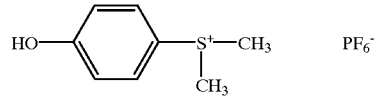
(PAG4-10)
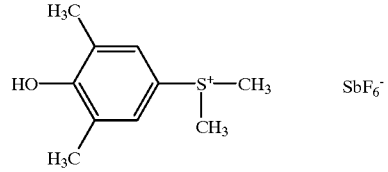
(PAG4-11)
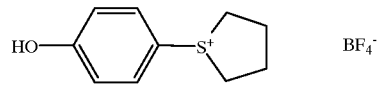
(PAG4-12)
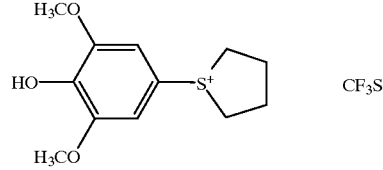
(PAG4-13)
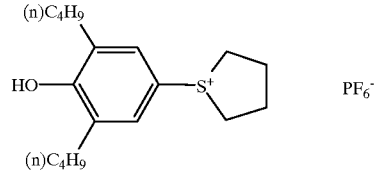
(PAG4-14)
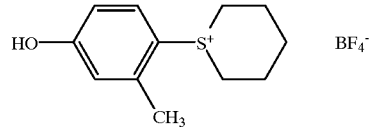
(PAG4-15)
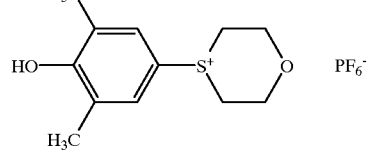
(PAG4-16)
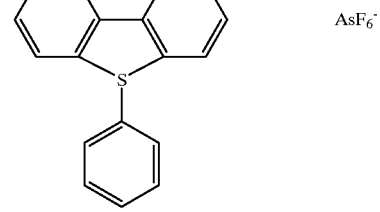
(PAG4-17)

(PAG4-18) 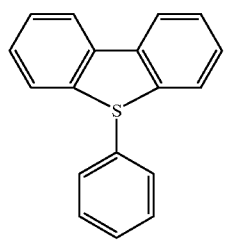 C$_8$F$_{17}$SO$_3^-$
(PAG4-28) 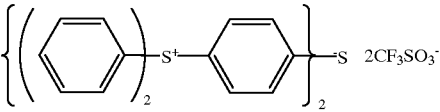 2CF$_3$SO$_3^-$
(PAG4-29) 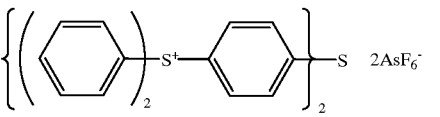 2AsF$_6^-$
(PAG4-19) 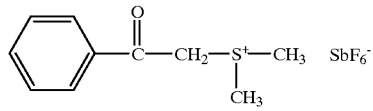 SbF$_6^-$
(PAG4-30) 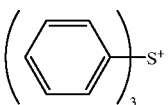
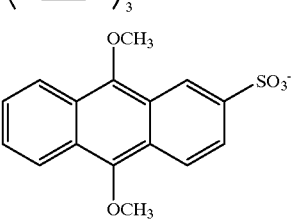
(PAG4-20) 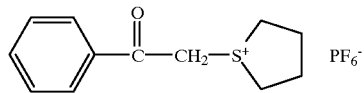 PF$_6^-$
(PAG4-21) 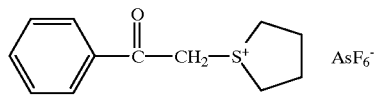 AsF$_6^-$
(PAG4-31) 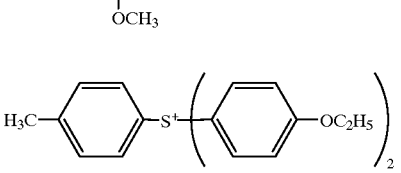
(PAG4-22) 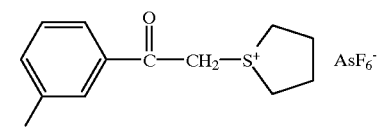 AsF$_6^-$
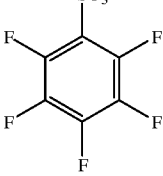
(PAG4-23) 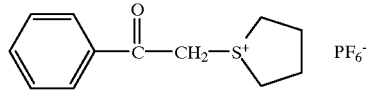 PF$_6^-$
(PAG4-32) 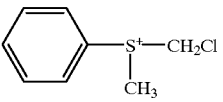
(PAG4-24) 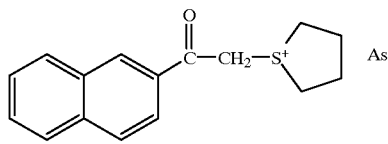 AsF$_6^-$
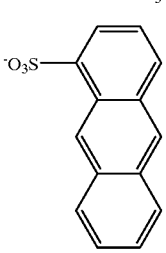
(PAG4-25) 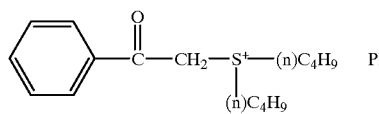 PF$_6^-$
(PAG4-26) 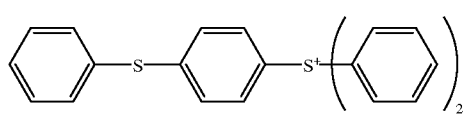 C$_8$H$_{17}$SO$_3^-$
(PAG4-33) 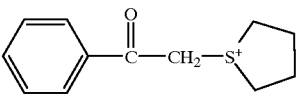
(PAG4-27)  SbF$_6^-$
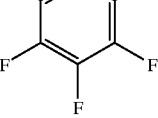

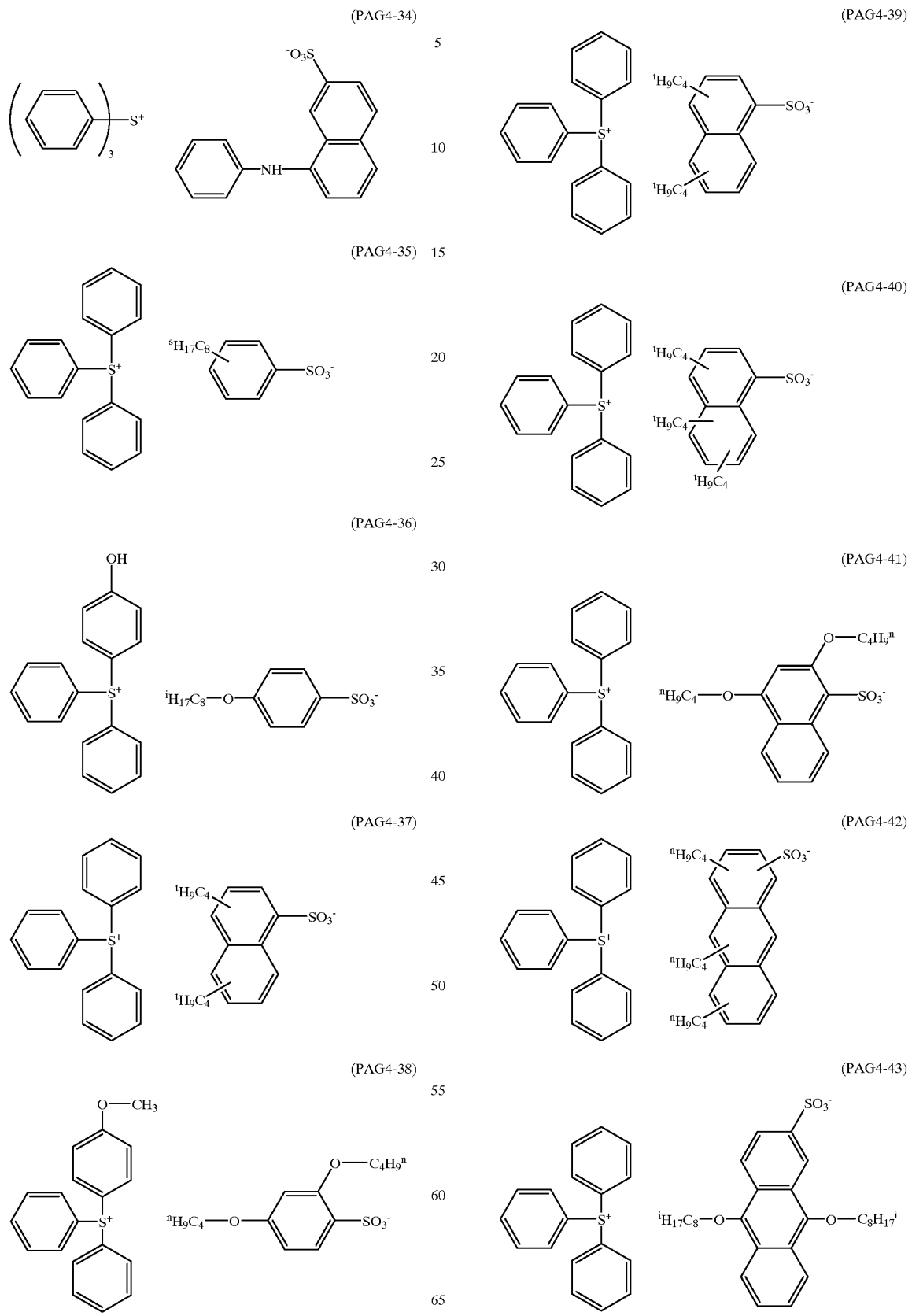

(PAG4-44)

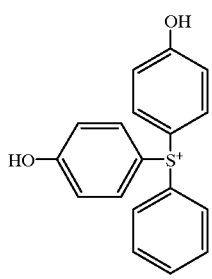

(PAG4-45)

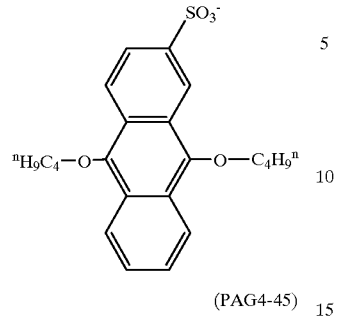

(PAG4-46)

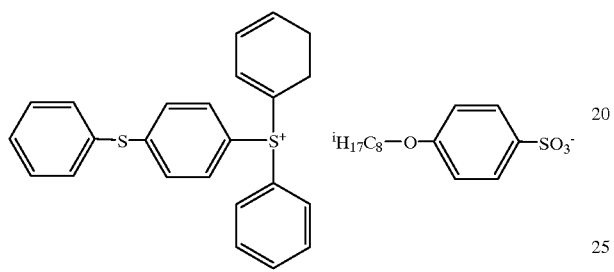

(PAG4-47)

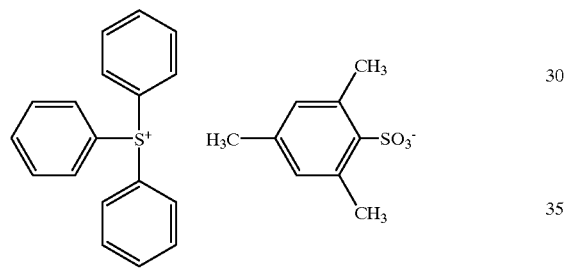

The above-described onium salts represented by formulas (PAG3) and (PAG4) are well-known, and can be synthesized, for example, by methods described in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polymer Chem. Ed.*, 18, 2677 (1980), U.S. Pat. Nos. 2,807,648 and 4,247,473, and JP-A-53-101331.

(3) Disulfone derivatives represented by the following formula (PAG5) or iminosulfonate derivatives represented by the following formula (PAG6):

$$Ar^3-SO_2-SO_2-Ar^4 \quad \text{(PAG5)}$$

(PAG6)

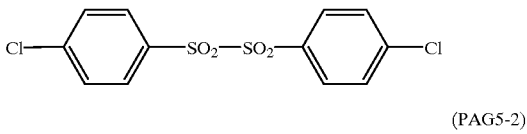

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

(PAG5-1)

(PAG5-2)

(PAG5-3)

(PAG5-4)

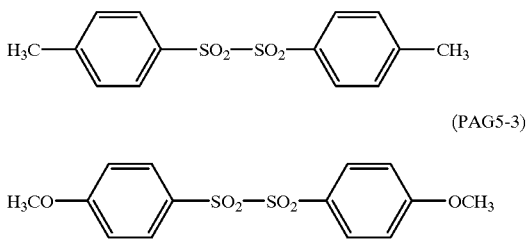

(PAG5-5)

(PAG5-6)

(PAG5-7)

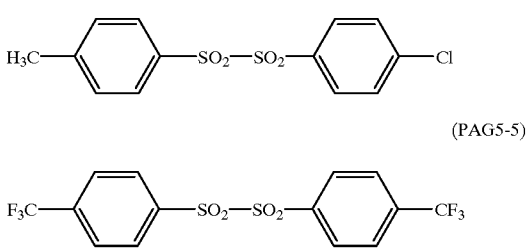

(PAG5-8)
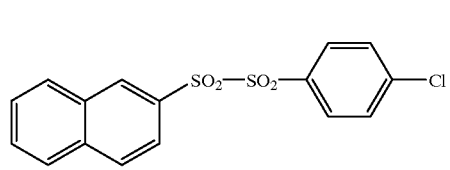
(PAG5-9)
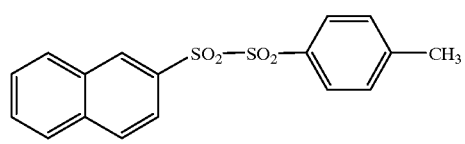
(PAG5-10)
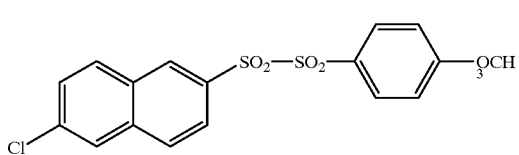
(PAG5-11)
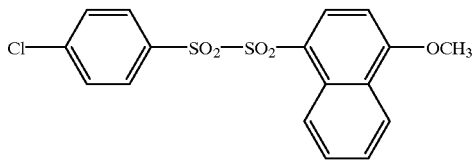
(PAG5-12)
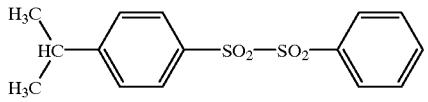
(PAG5-13)
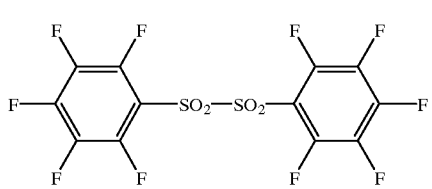
(PAG5-14)
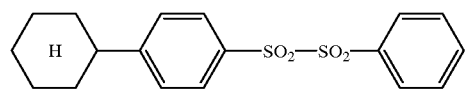
(PAG6-1)
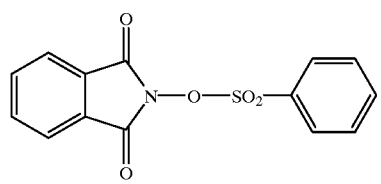
(PAG6-2)
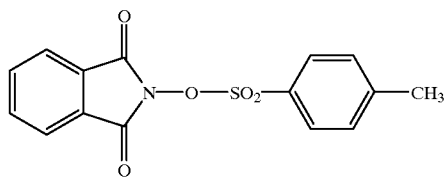
(PAG6-3)
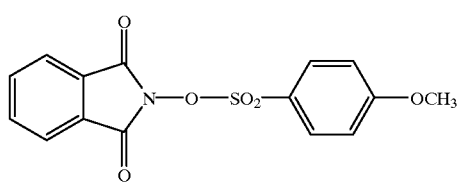
(PAG6-4)
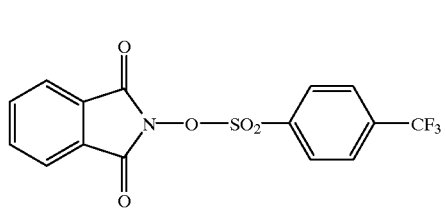
(PAG6-5)
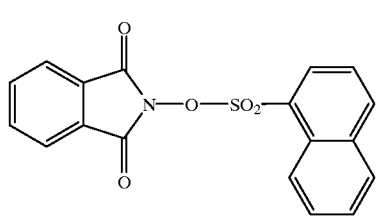
(PAG6-6)
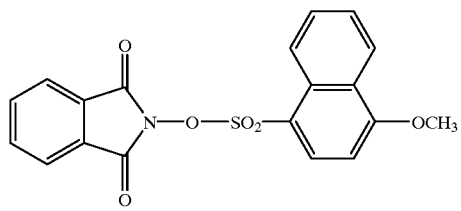
(PAG6-7)
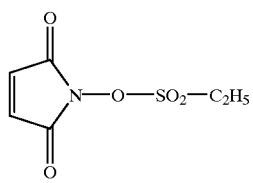
(PAG6-8)
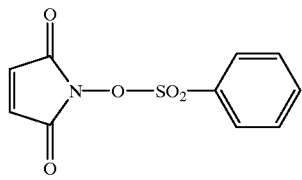

(PAG6-9)
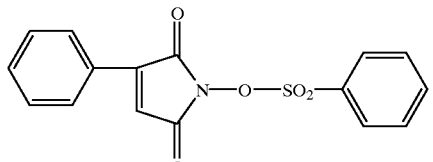

(PAG6-10)
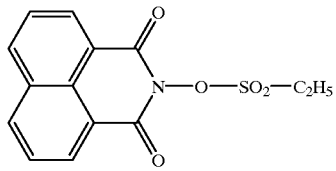

(PAG6-11)
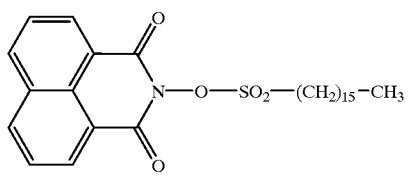

(PAG6-12)
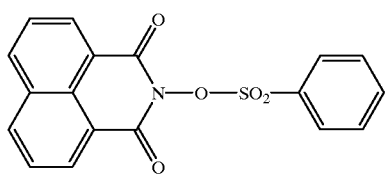

(PAG6-13)
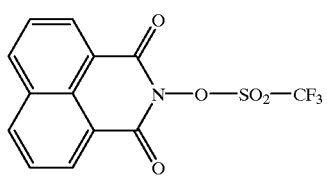

(PAG6-14)
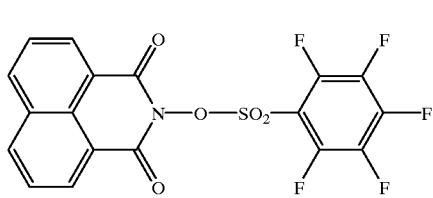

(PAG6-15)
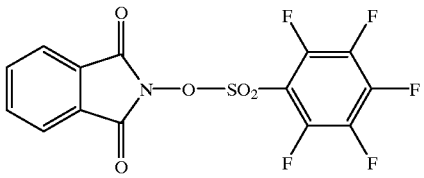

In the present invention, the photoacid generating agents are preferably onium salts, disulfones, 4-position DNQ (diazonaphthoquinone)sulfonates and triazine compounds.

The amount of these photoacid generating agents (b) added is usually within the range of 0.001% to 40% by weight, preferably within the range of 0.01% to 20% by weight, and more preferably within the range of 0.1% to 5% by weight, based on the total weight of the photoresist compositions of the present invention (excluding coating solvents). When the amount of the compounds added which are decomposable by irradiation of active light or radiation to generate acids is less than 0.001% by weight, the sensitivity is decreased. On the other hand, when the amount added is more than 40% by weight, the light absorption of resists becomes too high, unfavorably resulting in deterioration of profiles and narrowing of process (particularly bake) margins.

(c1) A phenolic compound in which at least a part of phenolic hydroxyl groups contained in a molecule are partially or completely protected by groups decomposable with an acid (acid-decomposable groups), or (c2) an aromatic or aliphatic carboxylic acid compound in which at least a part of carboxyl groups contained in a molecule are partially or completely protected by groups decomposable with an acid (acid-decomposable groups), which is used in the present invention, includes, for example, a phenolic compound selected from aromatic compounds each having from 2 to 7 aromatic rings and a molecular weight of from 186 to 1500, and hydroxystyrene copolymers each having a weight average molecular weight measured by the GPC method of from 2000 to 20000, in which 20 to 100% of hydroxyl groups thereof are protected by acid-decomposable groups.

The amount of component (c) (that is to say, the general term of (c1) and (c2)) added is preferably from 2% to 50% by weight, more preferably from 5% to 50% by weight, still more preferably from 5% to 40% by weight, yet more preferably from 10% to 40% by weight, particularly preferably from 10% to 30% by weight and most preferably from 20% to 30% be weight.

Specifically, the following compounds are exemplified as the component (c):

(1)

RO—⌬—C(=O)—⌬(OR)(OR)—OR (2)

RO—⌬(RO)(OR)—C(=O)—⌬(OR)(OR)—OR (3)

RO—⌬—S(=O)₂—⌬(OR)—OR (4)

RO—⌬(OR)—S—⌬(OR)—OR

-continued
(5)
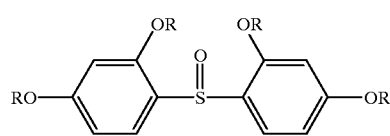
(6)
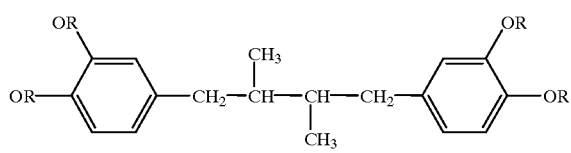
(7)
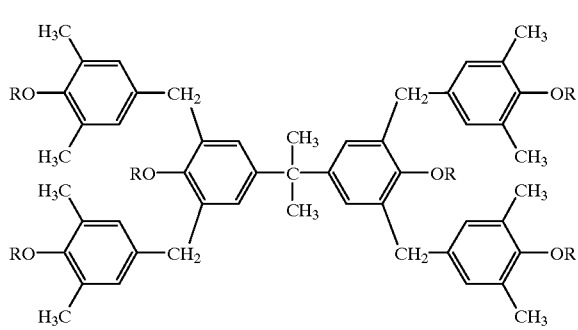
(8)
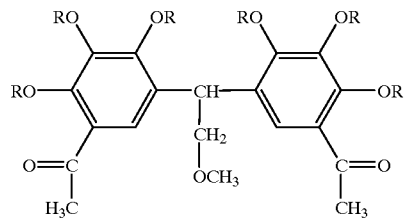
(9)
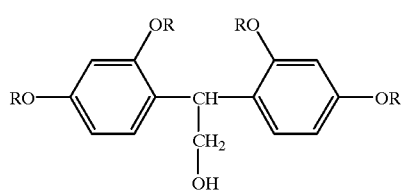
(10)
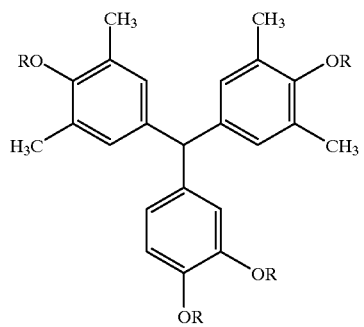
(11)
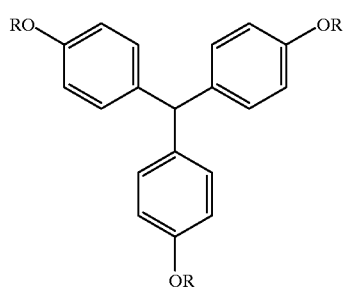
(12)
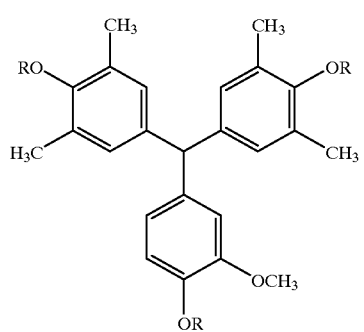
(13)
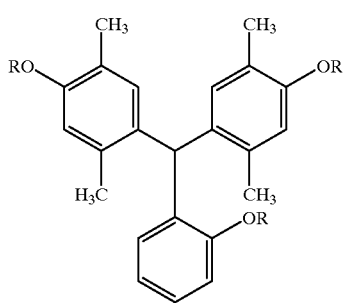
(14)
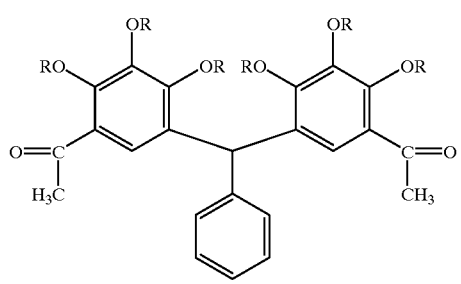

-continued
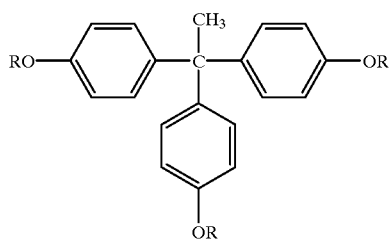 (15)
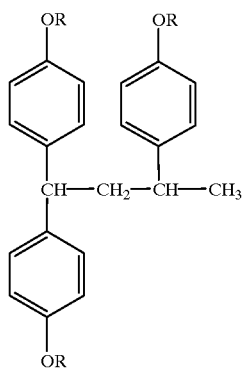 (16)
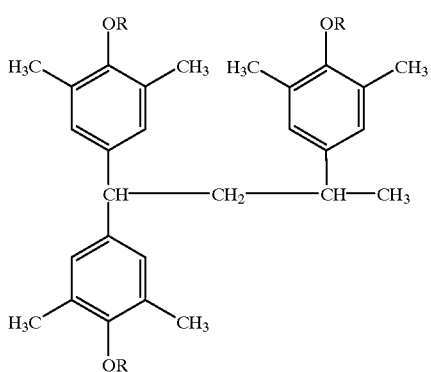 (17)
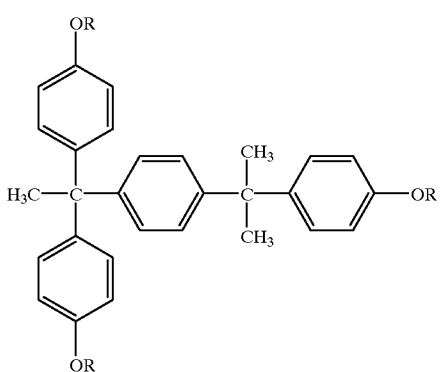 (18)
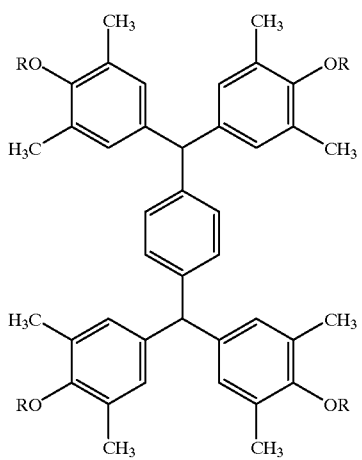 (19)
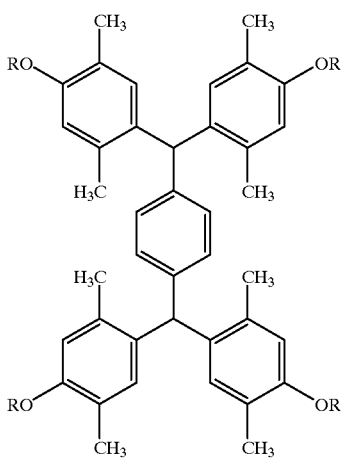 (20)
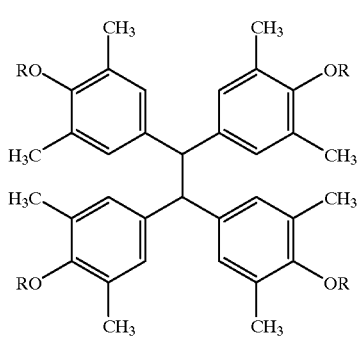 (21)
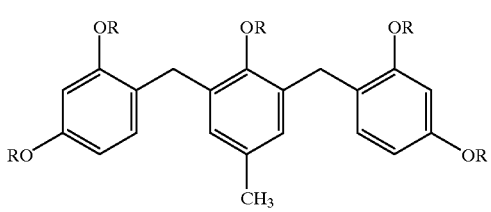 (22)

-continued
(23) 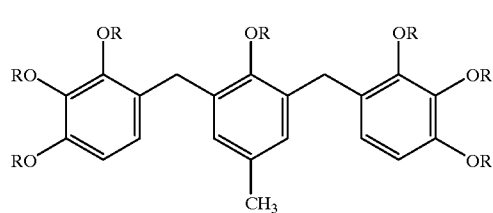
(24) 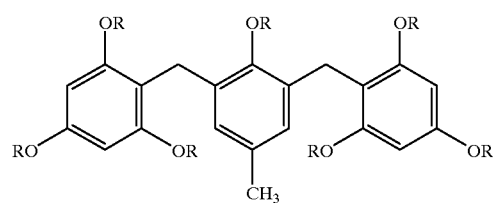
(25) 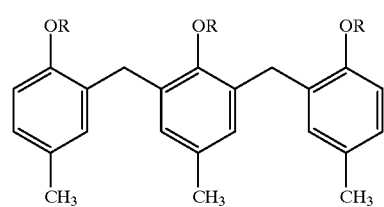
(26) 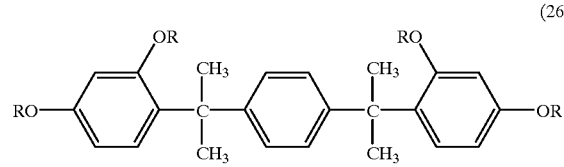
(27) 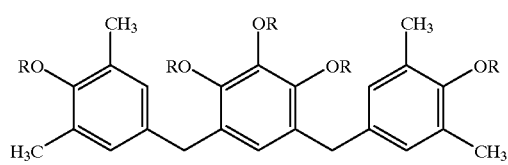
(28) 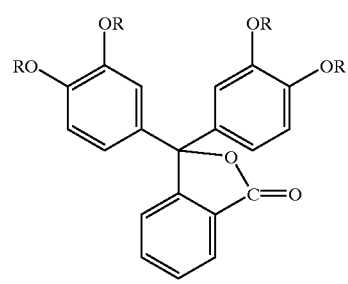
(29) 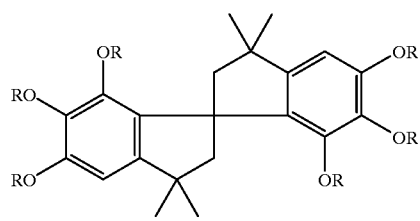
(30) 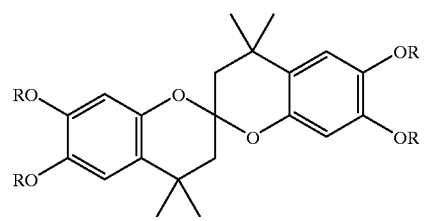
(31) 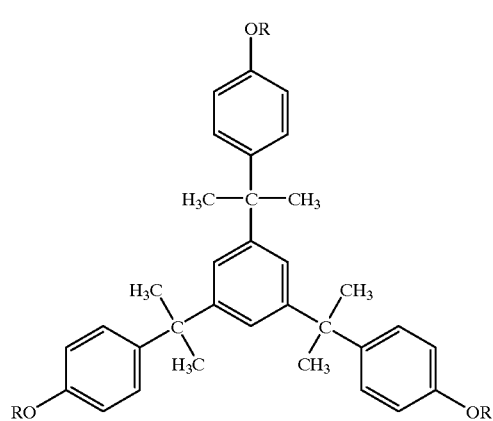
(32) 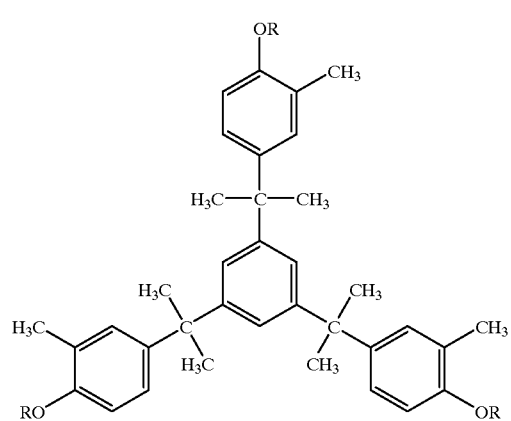

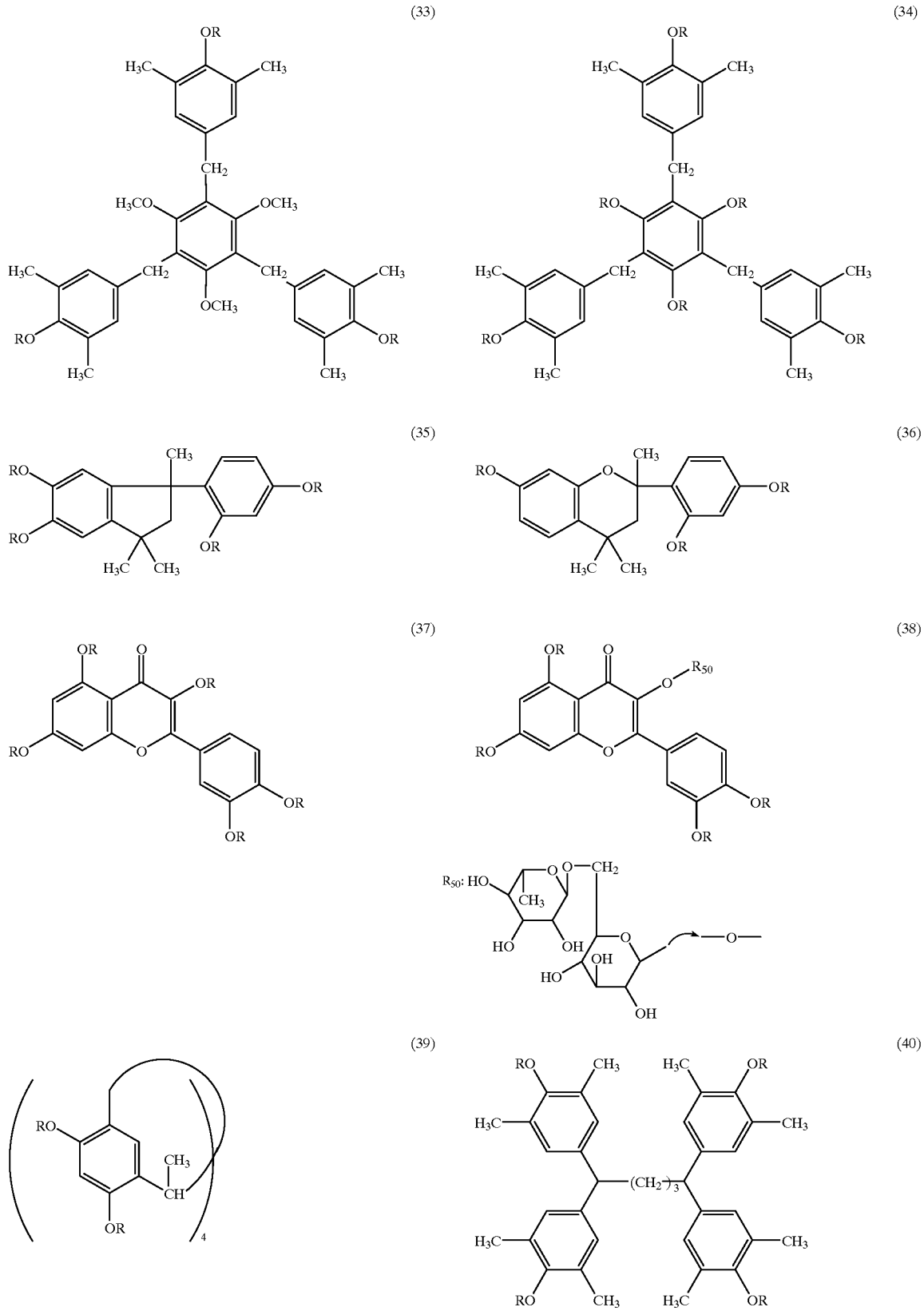

-continued
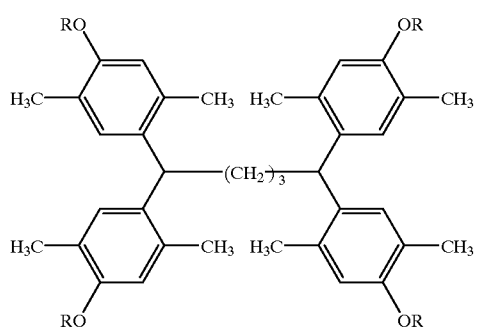 (41)
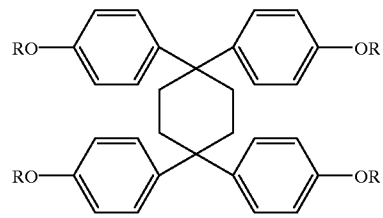 (42)
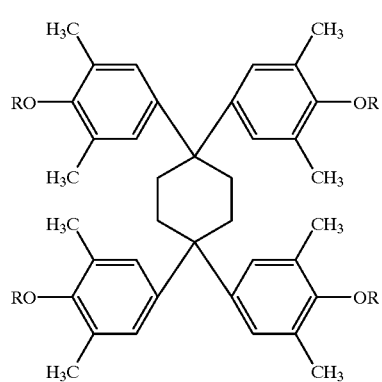 (43)
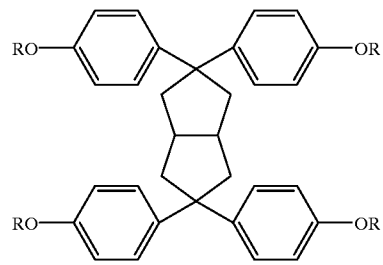 (44)
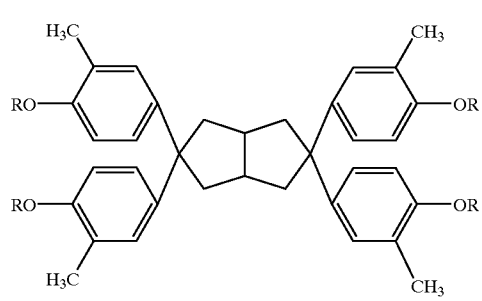 (45)
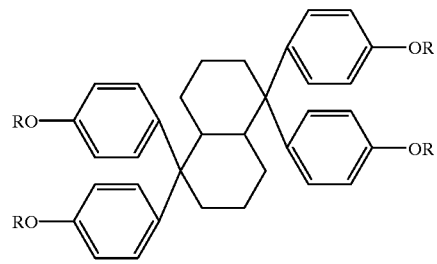 (46)
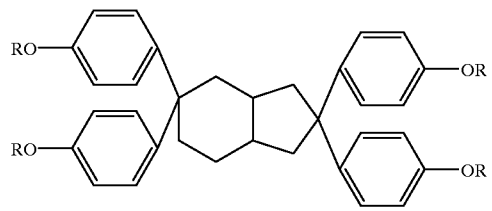 (47)
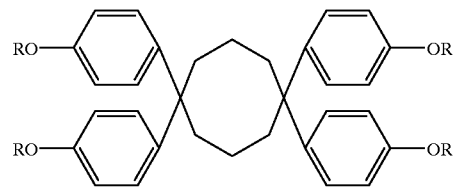 (48)
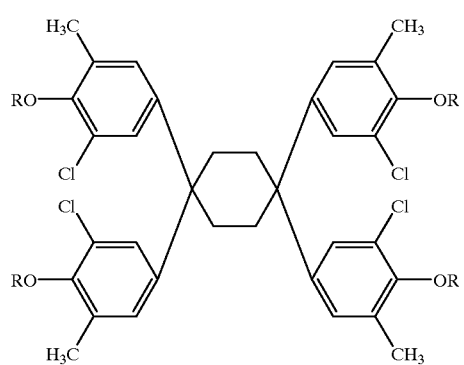 (49)
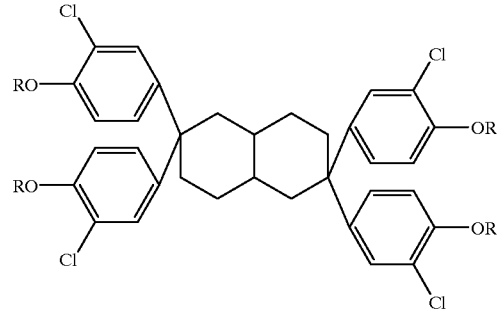 (50)

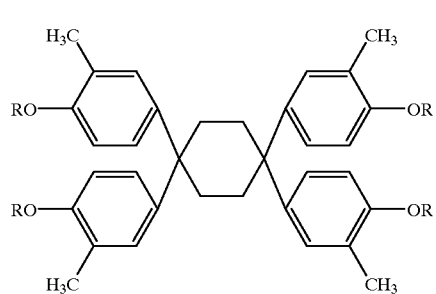
(51)
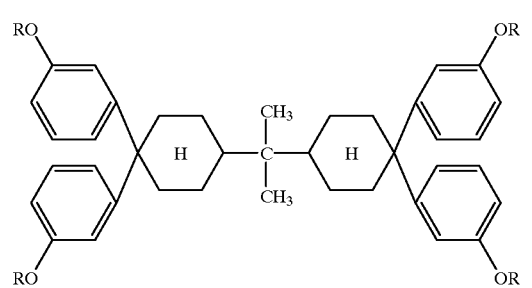
(52)
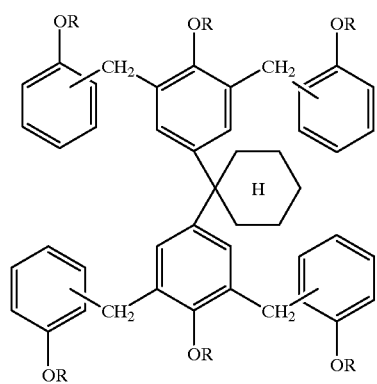
(53)
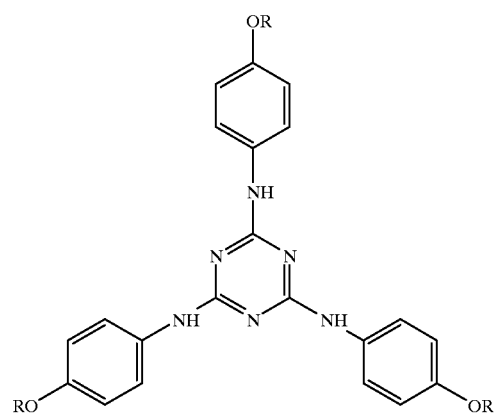
(54)
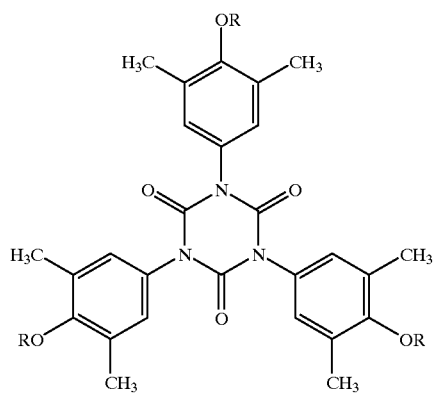
(55)
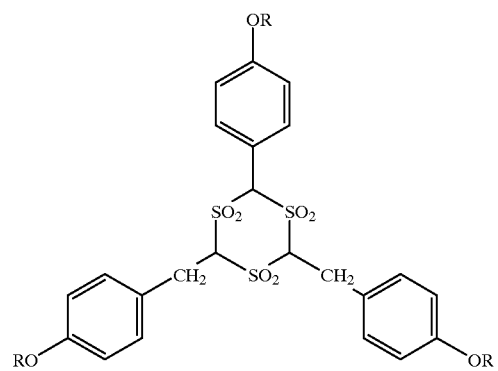
(56)

-continued
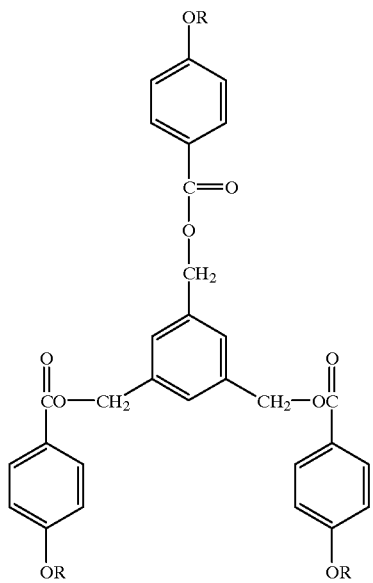 (57)
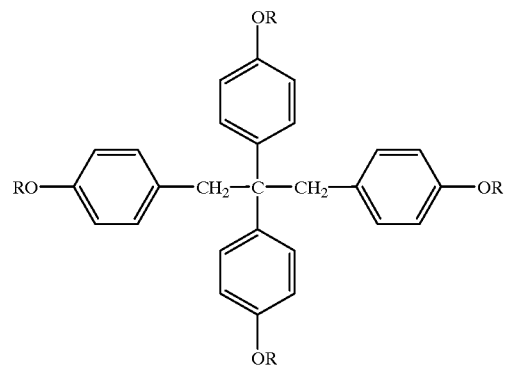 (58)
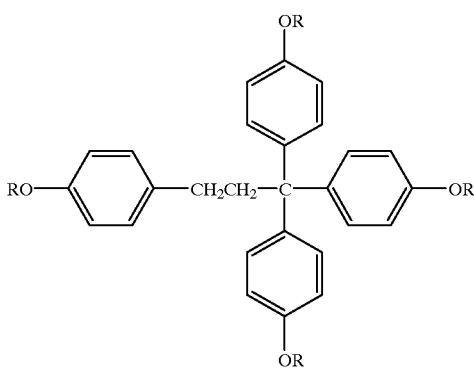 (59)
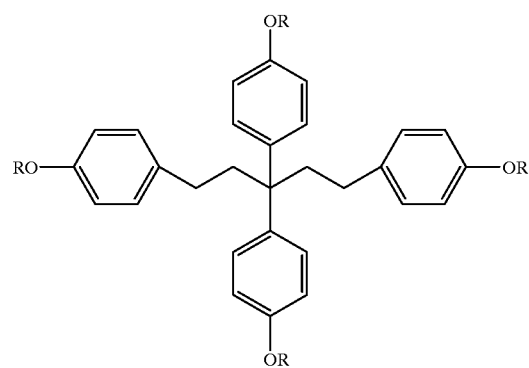 (60)
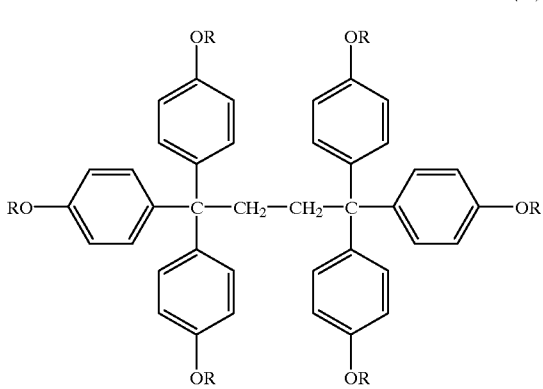 (61)
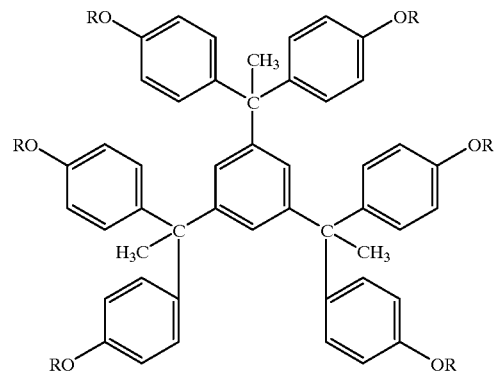 (62)

(63)
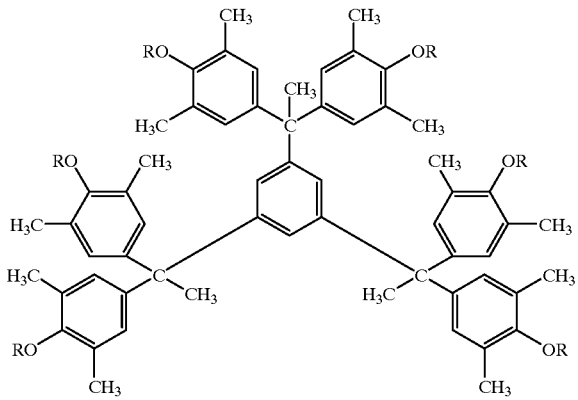
R's in compounds (1) to (63) are groups selected from an hydrogen atom, —CH$_2$—COO—C(CH$_3$)$_2$C$_6$H$_5$, —CH$_2$—COO—C$_4$H$_9^t$, —COO—C$_4$H$_9^t$ and
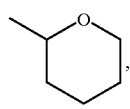
with the proviso that at least two or three depending on the structure are groups other than a hydrogen atom, and the respective substituents R's may be different.
(64)
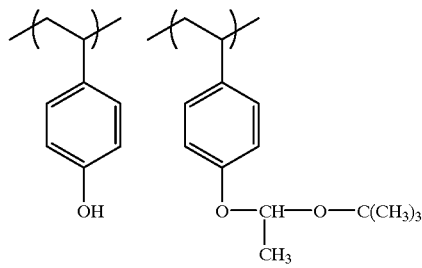
(65)
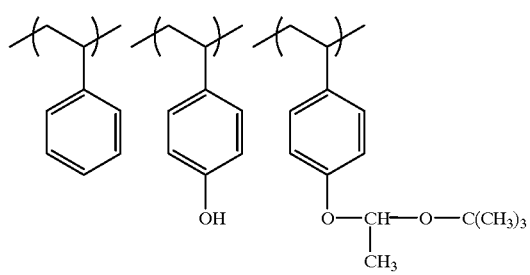
(66)
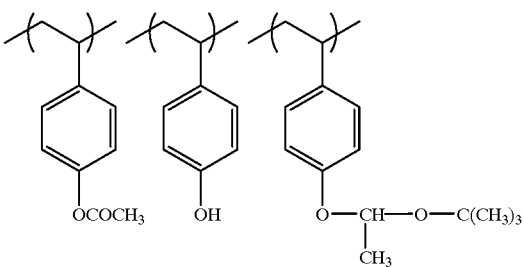
(67)
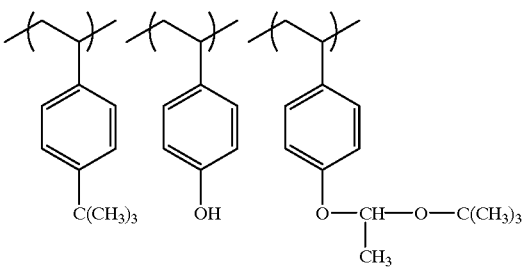
(68)
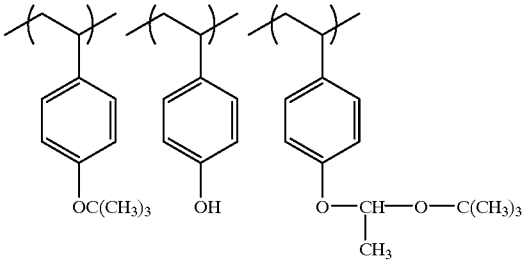

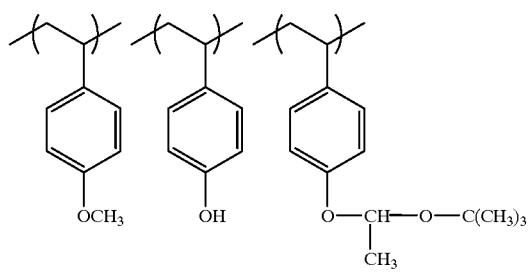
(69)
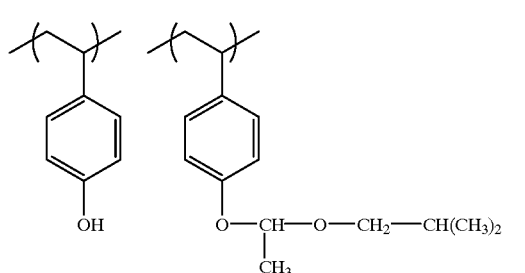
(70)
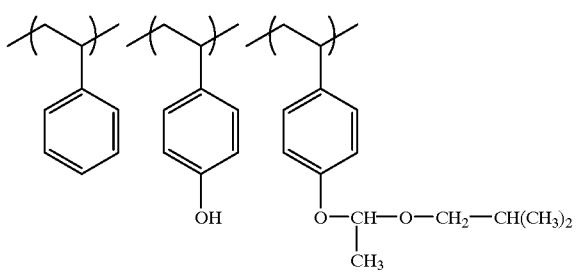
(71)
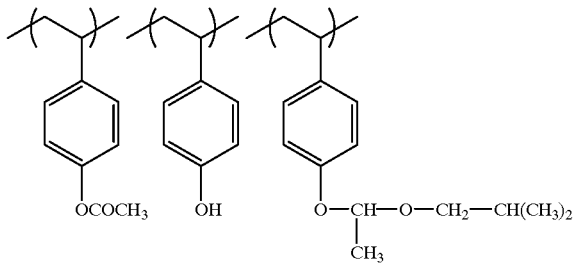
(72)
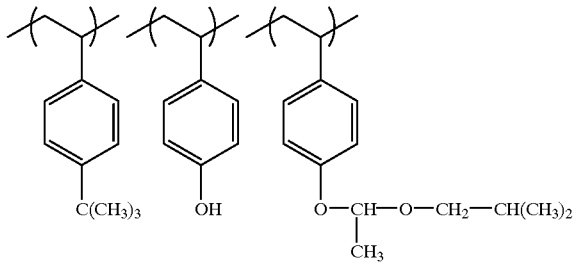
(73)
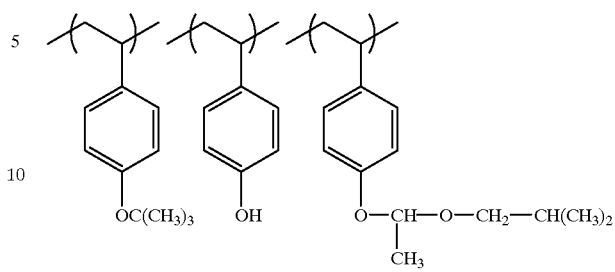
(74)
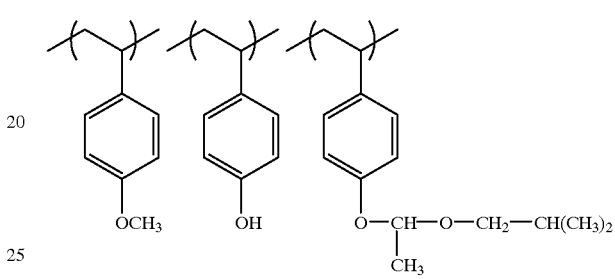
(75)
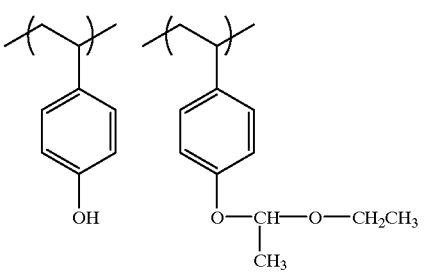
(76)
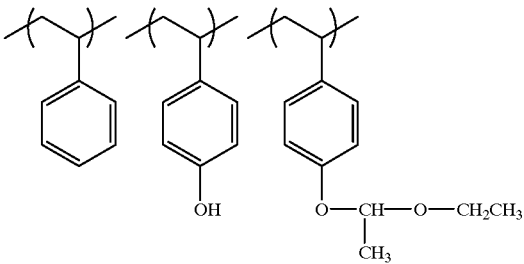
(77)
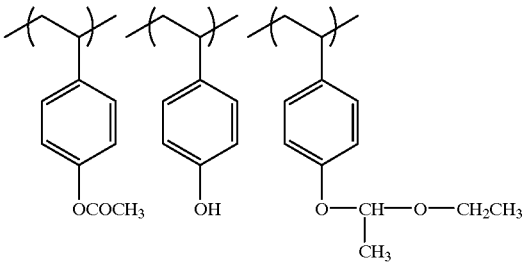
(78)

-continued (79)

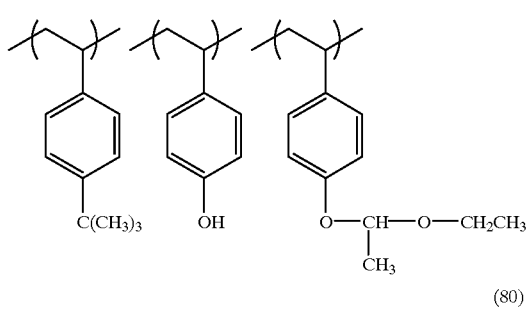

(80)

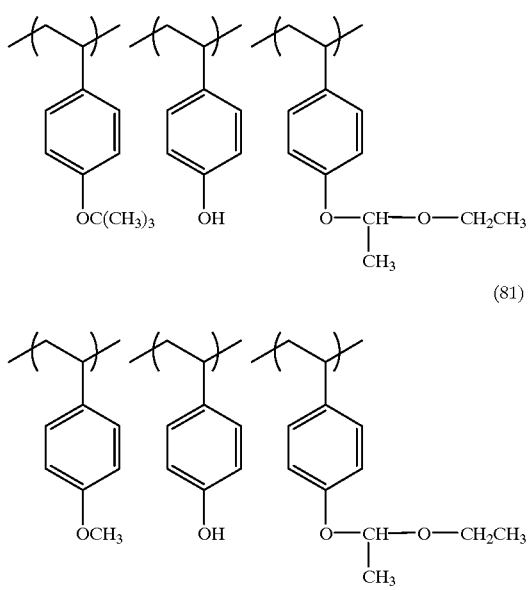

(81)

The compositions of the present invention may contain organic basic compounds, thereby preferably improving the stability in storage and decreasing changes in line width caused by PED. The organic basic compounds which can be used in the present invention are compounds stronger in basicity than phenol. Nitrogen-containing basic compounds are preferred among these.

Preferred examples thereof include structures of the following formulas (A) to (E):

(A)

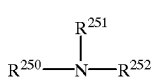

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may combine with each other to form a ring.

(B)

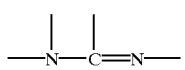

(C)

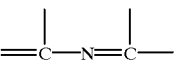

(D)

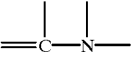

(E)

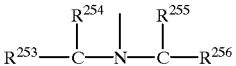

In the above-described formula (E), $R^{253}$, $R^{254}$, $R^{255}$ and $R^{256}$, which may be the same or different, each represents an alkyl group having from 1 to 6 carbon atoms.

More preferred are nitrogen-containing basic compounds each having two or more nitrogen atoms different in chemical environment, and particularly preferred are compounds each having both a substituted or unsubstituted amino group and a nitrogen atom-containing ring structure, or compounds having alkylamino groups. Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines. Preferred substituents are amino, aminoalkyl, alkylamino, aminoaryl, arylamino, alkyl, alkoxy, acyl, acyloxy, aryl, aryloxy, nitro, hydroxyl and cyano. Particularly preferred examples of the compounds include but are not limited to guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-amino-ethylpyridine, 3-aminopyrrolidine, piperazine, N-(2-amino-ethyl)piperazine, N-(2-aminoethyl)-piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used alone or as a combination of two or more of them. The amount of the nitrogen-containing basic compound used is usually from 0.001 part to 10 parts by weight, and preferably form 0.01 part to 5 parts by weight, based on 100 parts by weight of photosensitive resin composition (excluding solvent). Less than 0.001 part by weight does not give the effects of the present invention, whereas exceeding 10 parts by weight results in liability to decrease the sensitivity and to deteriorate the development properties of non-exposed areas.

The positive type photoresist compositions of the present invention may further contain surfactants, dyes, pigments, plasticizers, photosensitizers and compounds each having two or more phenolic OH groups for enhancing the solubility in developing solutions, as needed.

Preferred examples of the surfactants include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as Eftop EF301, EF303 and EF352 (manufactured by Shin Akita Kasei Co., Ltd.), Megafac F171 and 173 (manufactured by Dainippon Ink & Chemicals Inc.), Florard FC430 and FC431 (manufactured by Sumitomo 3M Ltd.), Asahiguard AG710, and Serflon S-382, SC101, SC102, SC103, SC104, SC105 and SC106 (manufactured by Asahi Glass Co., Ltd.); Organosiloxane Polymer KP341 (manufactured by Shin-Etsu Chemical Co., Ltd.); and acrylic acid or methacrylic acid (co)polymers, Polyflow No.75 and No. 95 (manufactured by Kyoeisha Yusi Kagaku Kogyo Co., Ltd.).

These surfactants may be added either alone or as a combination of some of them. The amount thereof added is preferably 0.0005 part to 0.01 part by weight based on 100 parts by weight of composition (excluding a solvent).

The suitable dyes are oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo Co., Ltd.), Crystal Violet (CI42555), Methyl Violet (CI42535), Rhodamine B (CI45170B), Malachite Green (CI42000) and Methylene Blue (CI52015).

Further, the following spectral sensitizers can be added to sensitize the compositions to a region of wavelengths longer than those of far ultraviolet rays, in which the photoacid generating agents used have no absorption, thereby allowing the chemical amplification type positive resists of the present invention to have the sensitivity to i- or g-rays. Preferred examples of the spectral sensitizers include but are not limited to benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, setoflavine-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinon, 1,2-benzanthraquinone, 3-methyl-1,3-diaza-1,9-benzanthrone, dibenzalacetone, 1,2-naphthoquinone, 3,3'-carbonyl-bis(5, 7-dimethoxycarbonyl-coumarin and coronene.

The compounds each having two or more phenolic OH groups for enhancing the solubility in developing solutions include polyhydroxy compounds. Preferred examples of the polyhydroxy compounds include phenols, resorcin, phloroglucin, phloro-glucide, 2,3,4-trihydroxybenzophenone, 2,3,4,4'-tetrahydoxybenzophenone, α, α', α"-tris(4-hydroxyphenyl)-1,3, 5-triisopropylbenzene, tris(4-hydroxyphenyl)methane, tris (4-hydroxyphenyl)ethane and 1,1'-bis(4-hydroxyphenyl) cyclo-hexane.

The positive type photoresist compositions of the present invention are dissolved in solvents (d) which can dissolve the above-described respective components, and applied onto supports. Preferred examples of the solvents which can be used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. These solvents (d) are used either alone or as a mixture thereof.

The positive type photoresist compositions of the present invention are applied onto substrates (for example, silicon/ silicon dioxide coatings) as used for the production of precision integrated circuit elements by appropriate coating methods such as methods using spinners or coaters, followed by exposure through specified masks, baking and development. Thus, good resist patterns can be obtained.

Developing solutions for the positive type photoresist compositions of the present invention include aqueous solutions of inorganic alkalis such as sodium hydroxide, potassium hydroxide, sodium carbonate, sodium silicate, sodium phosphate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; amides such as formamide and acetamide, quaternary ammonium salts such as tetramethylammonium hydroxide, trimethyl(2-hydroxyethyl)ammonium hydroxide, tetraethylammonium hydroxide, tributylmethylammonium hydroxide, tetra-ethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide and tetrabutylammonium hydroxide; and cyclic amines such as pyrrole and piperidine.

The positive type photoresist composition of the present invention is basically composed of components (a) and (b) described above, and further comprises component (c). However, for improving film properties and heat resistance, an alkali-soluble resin may further be added. Such alkali-soluble resins are preferably polymers having acidic hydrogen atoms having a pKa of 11 or less such as phenolic hydroxyl groups, carboxylic acid groups, sulfonic acid groups, imido groups, sulfonamido groups, N-sulfonylamido groups N-sulfonyl-urethane groups and active methylene groups.

Suitable examples of the alkali-soluble polymers include novolak phenol resins, specifically phenol-formaldehyde resins, o-cresol-formaldehyde resins, m-cresol-formaldehyde resins, p-cresol-formaldehyde resins, xylenol-formaldehyde resins and copolycondensation products thereof. A condensation product of phenol or cresol substituted by an alkyl group having from 3 to 8 carbon atoms, such as a t-butylphenol formaldehyde resin, and formaldehyde may further be used in combination with the phenol resin described below, as described in JP-A-50-125806. Furthermore, polymers having phenolic hydroxyl group-containing monomers such as N-(4-hydroxyphenyl) methacrylamide as copolymerization components, homopolymers or copolymers of p-hydroxystyrene, o-hydroxystyrene, m-isopropenylphenol and p-isopropenylphenol, or partially etherified or esterified products of these polymers can also be used.

When the positive type photoresist composition of the present invention is used as an upper-layer resist of two-layer resists, a lower-layer organic polymer film is etched by oxygen plasma using an upper-layer resist pattern as a protective mask. This upper-layer resist has sufficient resistance against oxygen plasma. Although the oxygen plasma resistance of the positive type photoresist composition of the present invention depends on the silicon content of the upper-layer resist, an etching apparatus and etching conditions, the etching selection ratio (the etching speed ratio of the lower-layer resist to the upper-layer resist) can be selected within a range as sufficiently wide as 10 to 100.

In a pattern formation method according to the positive type photoresist composition of the present invention, an organic polymer film is first formed on a substrate to be processed. This organic polymer film may be formed of any of various well-known photoresists, which include, for example, photoresists of the FH series and FHi series manufactured by Fuji Film Olin Co., Ltd., photoresists of the OiR series manufactured by Olin Co., Ltd., and photoresists of the PFI series manufactured by Sumitomo Chemical Co. Ltd. The organic polymer film is formed by dissolving any of these photoresists in an appropriate solvent, and applying the resulting solution by the spin coat method or the spray method. Then, a film of the positive type photoresist composition of the present invention is formed on the first layer of the above-described organic polymer film. This film is formed similarly to the first layer by dissolving the resist material in an appropriate solvent, and applying the resulting solution by the spin coat method or the spray method.

Then, the resulting two-layer resists are subjected to a pattern formation process. As the first step thereof, pattern formation treatment is conducted to the second layer, that is to say, the upper-layer film of the photoresist composition. Mask alignment is carried out as needed, and high-energy rays are irradiated through the mask, thereby making an irradiated portion of the photoresist composition soluble in aqueous alkali, followed by development with the aqueous alkali to form a pattern.

Then, as the second step, the organic polymer film is etched. This procedure is conducted by oxygen plasma etching, using the pattern of the resist composition film as a mask, to form a fine pattern having high aspect ratio. The etching of the organic polymer film by the oxygen plasma etching is a technique quite similar to plasma ashing utilized in separation of a resist film carried out after termination of etching processing of a substrate according to the conventional hot etching procedure.

For example, this operation can be carried out using a reactive gas (i.e., an oxygen gas as an etching gas) by a cylindrical plasma etching apparatus or a parallel flat plate plasma etching apparatus.

Further, although this resist pattern is carried out by processing a substrate as a mask, the dry etching method such as sputter-etching, gas-plasma etching and ion beam etching is utilized as the processing method.

The etching treatment due to two layer film-resist method including the resist film of the present invention is completed by the separation operation of the resist film.

The separation of the resist film can be merely carried out by dissolution treatment of organic high polymer material of the first layer. This organic high polymer material is an optinal photoresist. Further, since this organic high polymer material is not changed in quality (e.g., cured) by the above photo-etching operation, the well-known organic solvent of the photoresist itself can be used.

The separation can be also carried out by treatment such as plasma etching without use of solvent.

EXAMPLE

Synthesis examples, examples and comparative examples will be shown below, but the present invention is not limited to the following examples.

Synthesis Example I-1

<Synthesis of Polysiloxane (1')>

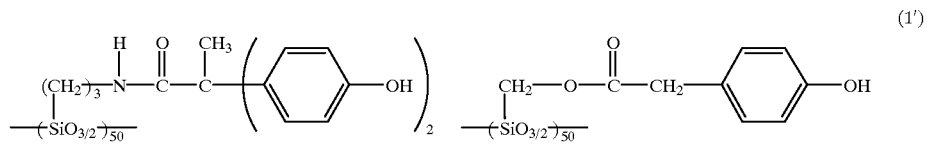

To 200 ml of dry N,N-dimethylacetamide, 28.7 g of diphenolic acid and 10.0 g of triethylamine were added, followed by cooling to −20° C. Then, 13.7 g of isobutyl chloroformate was added dropwise thereto for 2 hours, followed by reaction in an atmosphere of dry nitrogen at 0° C. for 2 hours. Then, 20 g of 3-aminopropyltrimethoxysilane was added dropwise thereto for 2 hours. Thereafter, reaction was conducted in an atmosphere of dry nitrogen at room temperature for 5 hours (the resulting solution is referred to as reaction solution A). Aside from this, 17.2 g of chloromethyltrimethoxysilane was added to 200 ml of dry N,N-dimethylacetamide, and then 15.2 g of 4-hydroxyphenylacetic acid, 3.0 g of potassium iodide and 16.0 g of DBU (1,8-diazabicyclo[5.4.0.]-7-undecene) were added thereto. Reaction was conducted in an atmosphere of dry nitrogen at a temperature of 70° C. to 90° C. for 5 hours (the resulting solution is referred to as reaction solution B).

After reaction solution B was cooled to room temperature, reaction solution A described above was added thereto. Then, 2 g of dimethylaminopyridine and 15 g of distilled water were added, and reaction was conducted at 50° C. for 3 hours, and subsequently at a temperature of 130° C. to 140° C. for 12 hours. The resulting reaction solution was neutralized with diluted hydrochloric acid, and then poured into 3 liters of distilled water with stirring to obtain a white powdery polymer. This was dissolved in 200 ml of acetone, and then an oligomer component of the polymer was fractionated by addition of distilled water with stirring. The lower layer was reprecipitated in 2 liters of distilled water to obtain a white polymer. The average molecular weight of this polymer was measured by the GPC (polystyrene standard). As a result, the weight average molecular weight was 5300, and the content of components having a molecular weight of 1000 or less was 5% by the GPC area ratio.

Synthesis Example I-2
<Synthesis of Polysiloxane (1)> solution was poured into 2 liters of distilled water with stirring to precipitate a polymer. Then, the polymer was dried under vacuum at room temperature to obtain 18 g of a desired acid-decomposable polysiloxane.

The protection rate of OH groups with ethyl vinyl ether was determined by the NMR. As a result, it was 58%. The

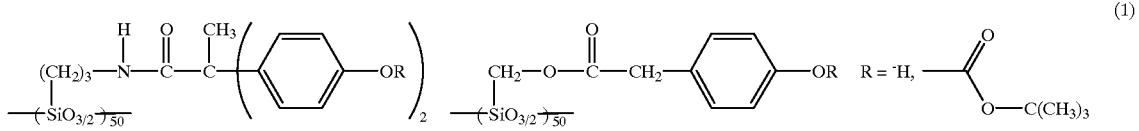

(1)

In 100 ml of THF, 20 g of polysiloxane (1') dried under vacuum was dissolved. After 4.8 g of t-butyl dicarbonate was added to the resulting solution, 2.8 g of triethylamine was added dropwise for 1 hour, followed by further reaction at room temperature for 10 hours. The resulting reaction weight average molecular weight of this polymer determined by the GPC was 6100.

Polysiloxanes described below were similarly synthesized.

Polysiloxane (1)

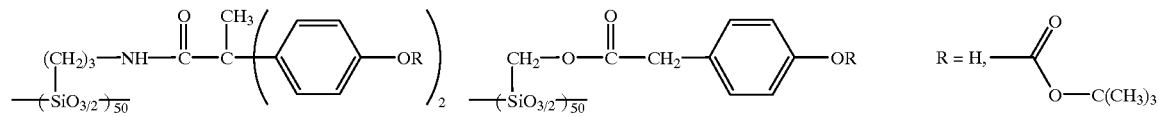

Polysiloxane (2)

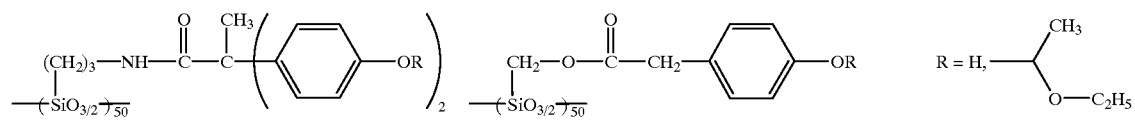

Polysiloxane (3)

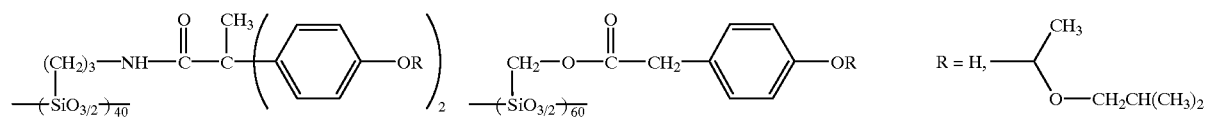

Polysiloxane (4)

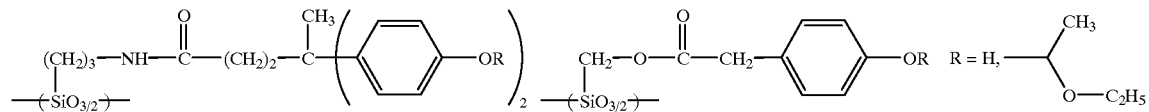

Polysiloxane (5)

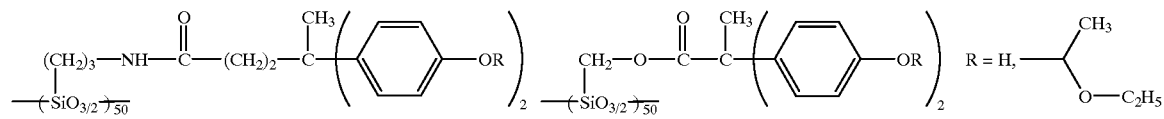

Polysiloxane (6)

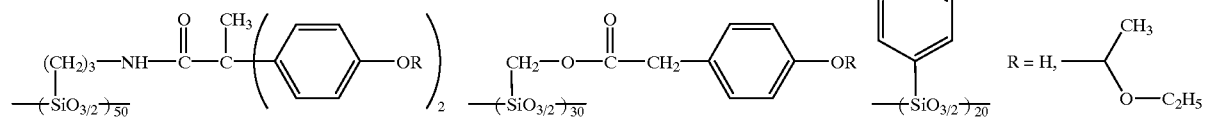

Polysiloxane (7)

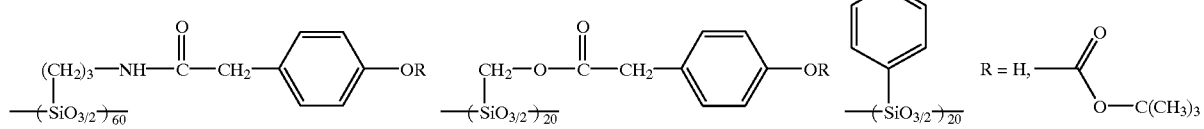

Example I-1

In 19.2 g of propylene glycol monomethyl ether acetate, 2 g of polysiloxane (1) as an acid-decomposable polysiloxane (component (a)), 0.08 g of triphenylsulfonium 2,4,6-triisopropylphenylsulfonate as a compound generating an acid by exposure (component (b)) and 0.012 g of triphenylimidazol were dissolved, followed by precision filtration through a 0.1 μm membrane filter.

An FHi-028D resist (a resist for i-rays, manufactured by Fuji Film Olin Co., Ltd.,) was applied onto a silicon wafer with a CDS-650 coater manufactured by Canon Inc., and baked at 90° C. for 90 seconds to obtain an uniform film having a thickness of 0.83 μm. This was further heated at 200° C. for 3 minutes. As a result, the thickness of the film was reduced to 0.71 μm. The silicon-containing resist prepared above was applied onto this film, and baked at 90° C. for 90 seconds to form a film having a thickness of 0.20 μm.

The wafer thus obtained was exposed using an FPA-3000EX3 KrF eximer laser stepper manufactured by Canon Inc., on which a resolution mask was mounted, while changing exposure and focus. Then, the wafer was heated in a clean room at 120° C. for 90 seconds, thereafter developed with a tetramethyl-ammonium hydroxide developing solution (2.38%) for 60 seconds, rinsed with distilled water, and dried to obtain a pattern. Observation under a scanning electron microscope showed that a line/space of 0.15 μm was resolved at a sensitivity of 32 mJ/cm$^2$. The rectangularity of the cross section was evaluated as A. The rectangularity of the cross section was compared by three-rank evaluation as follows. That is to say, the angle between a substrate and a side wall of the resist pattern was measured. When the angle was from 80° to 90°, the rectangularity was evaluated as A. When the angle was from 70° to less than 80°, the rectangularity was evaluated as B. When the angle was less than 70°, the rectangularity was evaluated as C. The above-described wafer was subjected to etching treatment by use of a parallel flat plate type reactive ion etching apparatus manufactured by ULVAC CO., LTD., using oxygen as an etching gas, at a pressure of 20 mTorr at an application power of 100 mW/cm$^2$ for 15 minutes, followed by observation under a scanning electron microscope. The dimension shift of the 0.15 μm pattern was 0.007 μm.

Examples I-2 To I-14

Positive type photoresists were prepared in the same manner as with Example I-1 with the exception that the acid-decomposable polysiloxane (component (a)) and the acid generating agent (component (b)) used in Example I-1 were each replaced by components (a) and components (b) described in Table I-1, respectively, and exposed, developed and etched in the same manner as with Example I-1. Results thereof are shown in Table I-2.

TABLE I-1

| | Polysiloxane Component (a) | | | |
|---|---|---|---|---|
| Example | Structure | Molecular Weight | Protection Rate | Acid Generating Agent Component (b) |
| I-1 | Polysiloxane (1) | 5100 | 49 | Triphenylsulfonium 2,4,6-triisopropylphenylsulfonate |
| I-2 | Polysiloxane (1) | 5100 | 49 | Triphenylsulfonium pentafluorophenylsulfonate |
| I-3 | Polysiloxane (2) | 6100 | 58 | Bis(p-t-amylphenyl)-iodonium tosylate |
| I-4 | Polysiloxane (2) | 6100 | 58 | Triphenylsulfonium 2,4,6-triisopropylphenylsulfonate |
| I-5 | Polysiloxane (3) | 4800 | 68 | Diphenyliodonium triflate |
| I-6 | Polysiloxane (3) | 4800 | 73 | Triphenylsulfonium p-dodecylphenylsulfonate |
| I-7 | Polysiloxane (4) | 3900 | 45 | Triphenylsulfonium nanofluorobutanesulfonate |
| I-8 | Polysiloxane (4) | 3900 | 63 | Triphenylsulfonium 2,4,6-triisopropylphenylsulfonate |
| I-9 | Polysiloxane (5) | 7800 | 59 | Triphenylsulfonium pentafluorophenylsulfonate |
| I-10 | Polysiloxane (5) | 7800 | 75 | Bis(p-t-amylphenyl)-iodonium 2,4,6-triisopropylphenylsulfonate |
| I-11 | Polysiloxane (6) | 7100 | 50 | Triphenylsulfonium 2,4,6-trimethylphenylsulfonate |
| I-12 | Polysiloxane (6) | 7100 | 68 | Triphenylsulfonium p-dodecylphenylsulfonate |
| I-13 | Polysiloxane (7) | 5600 | 66 | Triphenylsulfonium 2,4,6-trimethylphenylsulfonate |
| I-14 | Polysiloxane (7) | 5600 | 58 | Triphenylsulfonium 2,4,6-triisopropylphenylsulfonate |

TABLE I-2

| Example | Resolution μm | Sensitivity mJ/cm$^2$ | Rectangularity, SEM Observation | Dimension Shift After Etching μm |
|---|---|---|---|---|
| I-1 | 0.15 | 32 | A | 0.007 |
| I-2 | 0.16 | 35 | A | 0.006 |
| I-3 | 0.15 | 43 | A | 0.006 |
| I-4 | 0.16 | 46 | B | 0.007 |
| I-5 | 0.15 | 37 | A | 0.006 |
| I-6 | 0.17 | 35 | A | 0.009 |
| I-7 | 0.16 | 46 | B | 0.007 |
| I-8 | 0.16 | 53 | A | 0.008 |
| I-9 | 0.15 | 46 | A | 0.007 |

TABLE I-2-continued

| Example | Resolution μm | Sensitivity mJ/cm² | Rectangularity, SEM Observation | Dimension Shift After Etching μm |
|---|---|---|---|---|
| I-10 | 0.16 | 43 | B | 0.006 |
| I-11 | 0.16 | 52 | A | 0.007 |
| I-12 | 0.15 | 46 | A | 0.007 |
| I-13 | 0.16 | 35 | A | 0.008 |
| I-14 | 0.16 | 35 | A | 0.008 |

Example I-15

A positive type photoresist was prepared in the same manner as with Example I-1 with the exception that 1.9 g of polysiloxane (1) as an acid-decomposable siloxane (component (a)), 0.12 g of triphenylsulfonium 2,4,6-triisopropyl-phenylsulfonate as an acid generating agent (component(b)), 0.012 g of triphenylimidazole and 0.19 g of compound example (18) (wherein R=CH$_2$COOC(CH$_3$)$_3$) as component (c) were used. Further, coating, exposure, development and etching treatment were conducted in the same manner as Example I-1, followed by observation under a scanning electron microscope. The composition of the resist prepared is shown in Table I-3, and results of evaluation are shown in Table I-4.

Examples I-16 to I-28

Positive type photoresists were prepared in the same manner as with Example I-15 with the exception that the acid-decomposable polysiloxane (component (a)), the acid generating agent (component (b)) and component (c) used in Example I-15 were each replaced by components (a), components (b) and components (c) described in Table I-3, respectively, and exposed, developed and etched in the same manner as with Example I-15. Results thereof are shown in Table I-4.

TABLE I-3

| Example | Siloxane Component (a) | Component (c) Structure | Amount Added | Acid Generating Agent Component (b) |
|---|---|---|---|---|
| I-15 | (1) Mw = 5100 | (18) R=CH$_2$CO$_2$C(CH$_3$)$_3$ | 10 | Triphenylsulfonium 2,4,6-triisopropyl-phenylsulfonate |
| I-16 | (1) Mw = 5100 | (60) R=CH$_2$CO$_2$C(CH$_3$)$_3$ | 15 | Triphenylsulfonium 2,4,6-trimethyl-phenylsulfonate |
| I-17 | (2) Mw = 6100 | (60) R=CH$_2$CO$_2$C(CH$_3$)$_3$ | 15 | Triphenylsulfonium 2,4,6-triisopropyl-phenylsulfonate |
| I-18 | (2) Mw = 6100 | (60) R=CH$_2$CO$_2$C(CH$_3$)$_3$ | 10 | Triphenylsulfonium 2,4,6-triisopropyl-phenylsulfonate |
| I-19 | (3) Mw = 4800 | (60) R=CH$_2$CO$_2$C(CH$_3$)$_3$ | 15 | Triphenylsulfonium pentafluorophenyl-sulfonate |
| I-20 | (3) Mw = 4800 | (70) | 10 | Triphenylsulfonium 2,4,6-triisopropyl-phenylsulfonate |
| I-21 | (4) Mw = 3900 | (18) R=CH$_2$CO$_2$C(CH$_3$)$_3$ | 15 | Triphenylsulfonium 2,4,6-triisopropyl-phenylsulfonate |
| I-22 | (4) Mw = 3900 | (18) R=CH$_2$CO$_2$C(CH$_3$)$_3$ | 20 | Triphenylsulfonium pentafluorophenyl-sulfonate |
| I-23 | (5) Mw = 7800 | (60) R=CH$_2$CO$_2$C(CH$_3$)$_3$ | 20 | Triphenylsulfonium pentafluorophenyl-sulfonate |
| I-24 | (5) Mw = 7800 | (60) R=CH$_2$CO$_2$C(CH$_3$)$_3$ | 10 | Triphenylsulfonium 2,4,6-triisopropyl-phenylsulfonate |
| I-25 | (6) Mw = 7100 | (60) R=CH$_2$CO$_2$C(CH$_3$)$_3$ | 15 | Triphenylsulfonium pentafluorophenyl-sulfonate |
| I-26 | (6) Mw = 7100 | (18) R=CH$_2$CO$_2$C(CH$_3$)$_3$ | 15 | Triphenylsulfonium pentafluorophenyl-tosylate |
| I-27 | (7) Mw = 5600 | (70) | 15 | Triphenylsulfonium pentafluorophenyl-tosylate |
| I-28 | (7) Mw = 5600 | (70) | 15 | Triphenylsulfonium 2,4,6-triisopropyl-phenylsulfonate |

The amount of component (c) added was indicated by percent by weight based on component (a).

TABLE I-4

| Example | Resolution μm | Sensitivity MJ/cm² | Rectangularity, SEM Observation | Dimension Shift After Etching μm |
|---|---|---|---|---|
| I-15 | 0.16 | 22 | B | 0.008 |
| I-16 | 0.16 | 18 | A | 0.008 |
| I-17 | 0.15 | 19 | A | 0.009 |
| I-18 | 0.16 | 20 | B | 0.007 |
| I-19 | 0.16 | 23 | B | 0.008 |
| I-20 | 0.16 | 18 | A | 0.011 |
| I-21 | 0.15 | 19 | B | 0.009 |
| I-22 | 0.16 | 26 | B | 0.010 |
| I-23 | 0.16 | 21 | A | 0.007 |
| I-24 | 0.16 | 18 | B | 0.010 |
| I-25 | 0.16 | 22 | A | 0.010 |
| I-26 | 0.15 | 18 | A | 0.007 |
| I-27 | 0.16 | 20 | B | 0.009 |
| I-28 | 0.16 | 20 | A | 0.009 |

Comparative Example I-1

A positive type photoresist was prepared in the same manner as with Example I-1 with the exception that the polysiloxane used in Example I-1 was replaced by polysiloxane D-1 (Mw=13800) described below, and exposed, developed and etched in the same manner as with Example I-1, followed by observation under a scanning electron microscope in the same manner as with Example I-1. Results thereof are shown in Table I-5.

Comparative Example I-2

A positive type photoresist was prepared in the same manner as with Example I-1 with the exception that the polysiloxane used in Example I-1 was replaced by polysiloxane D-2 (Mw=10300) described below, and exposed, developed and etched in the same manner as with Example I-1, followed by observation under a scanning electron microscope in the same manner as with Example I-1. Results thereof are shown in Table I-5.

Comparative Example I-3

A positive type photoresist was prepared in the same manner as with Example I-15 with the exception that the polysiloxane used in Example I-15 was replaced by polysiloxane D-2 (Mw=10300) described below, and exposed, developed and etched in the same manner as with Example I-1, followed by observation under a scanning electron microscope in the same manner as with Example I-1. Results thereof are shown in Table I-5.

TABLE I-5

| Comparative Example | Resolution Mm | Sensitivity mJ/cm$^2$ | Rectangularity, SEM Observation | Dimension Shift After Etching μm |
| --- | --- | --- | --- | --- |
| I-1 | 0.26 | 36 | B | 0.020 |
| I-2 | 0.19 | 35 | C | 0.012 |
| I-3 | 0.20 | 38 | C | 0.011 |

The polysiloxanes used in Comparative Examples described above were as follows:
Compounds Used in Comparative Examples

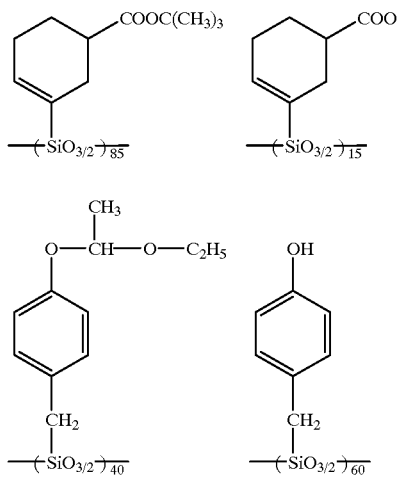

From the results shown in Tables I-1 to I-5, the following are apparent.

The positive type photoresist compositions of the present invention in which the polysiloxanes of the present invention are used give resists having high resolution, good rectangularity and decreased dimension shift of pattern, and these characteristics are well balanced.

On the other hand, in the case of Comparative Examples I-1 to I-3 in which the polysiloxanes of the present invention are not used, the above-described characteristics are poorly balanced.

The positive type photoresist compositions of the present invention in which the polysiloxanes of the present invention are used give resists having high sensitivity, high resolution and rectangularity. Further, when the positive type photoresist compositions of the present invention are used as upper-layer resists in the two-layer resist system, fine patterns decreased in dimension shift and high in aspect ratio can be formed in pattern transfer to the lower layers using the oxygen plasma etching process.

Synthesis Example II-1

<Synthesis of Polysiloxane (1)>

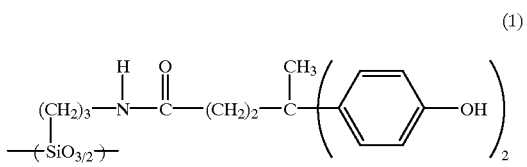

To 200 ml of dry N,N-dimethylacetamide, 28.7 g of diphenolic acid and 10.0 g of triethylamine were added, followed by cooling to −20° C. Then, 13.7 g of isobutyl chloroformate was added dropwise thereto for 2 hours, followed by reaction in an atmosphere of dry nitrogen at 0° C. for 2 hours. Then, 20 g of 3-aminopropyltrimethoxysilane was added dropwise thereto for 2 hours. Thereafter, reaction was conducted in an atmosphere of dry nitrogen at room temperature for 5 hours.

Then, 2 g of dimethylaminopyridine and 15 g of distilled water were added thereto, and reaction was conducted at 50° C. for 3 hours, and subsequently at a temperature of 130° C. to 140° C. for 12 hours. The resulting reaction solution was neutralized with diluted hydrochloric acid, and then poured into 3 liters of distilled water with stirring to obtain a white powdery polymer. This was dissolved in 200 ml of acetone, and then an oligomer component of the polymer was fractionated by addition of distilled water with stirring. The lower layer was reprecipitated in 2 liters of distilled water to obtain a white polymer.

The average molecular weight of this polymer was measured by the GPC (polystyrene standard). As a result, the weight average molecular weight was 4300, and the content of components having a molecular weight of 1000 or less was 8% by the GPC area ratio.

Synthesis Example II-2

<Synthesis of Polysiloxane (2)>

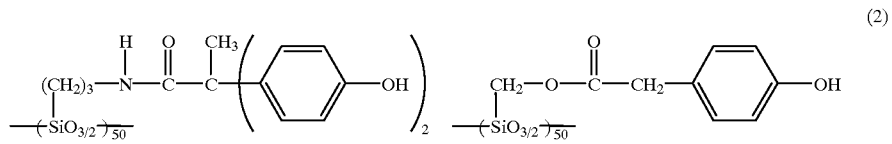

To 200 ml of dry N,N-dimethylacetamide, 28.7 g of diphenolic acid and 10.0 g of triethylamine were added, followed by cooling to −20° C. Then, 13.7 g of isobutyl chloroformate was added dropwise thereto for 2 hours, followed by reaction in an atmosphere of dry nitrogen at 0° C. for 2 hours.

Then, 20 g of 3-aminopropyltrimethoxysilane was added dropwise thereto for 2 hours. Thereafter, reaction was conducted in an atmosphere of dry nitrogen at room temperature for 5 hours (the resulting solution is referred to as reaction solution A).

Aside from this, 17.2 g of chloromethyltrimethoxysilane was added to 200 ml of dry N,N-dimethylacetamide, and then 15.2 g of 4-hydroxyphenylacetic acid, 3.0 g of potassium iodide and 16.0 g of DBU (1,8-diazabicyclo[5.4.0]-7-undecene) were added thereto. Reaction was conducted in an atmosphere of dry nitrogen at a temperature of 70° C. to 90° C. for 5 hours (the resulting solution is referred to as reaction solution B).

After reaction solution B was cooled to room temperature, reaction solution A described above was added thereto.

Then, 2 g of dimethylaminopyridine and 15 g of distilled water were added, and reaction was conducted at 50° C. for 3 hours, and subsequently at a temperature of 130° C. to 140° C. for 12 hours. The resulting reaction solution was neutralized with diluted hydrochloric acid, and then poured into 3 liters of distilled water with stirring to obtain a white powdery polymer.

This was dissolved in 200 ml of acetone, and then an oligomer component of the polymer was fractionated by addition of distilled water with stirring. The lower layer was reprecipitated in 2 liters of distilled water to obtain a white polymer. The average molecular weight of this polymer was measured by the GPC (polystyrene standard). As a result, the weight average molecular weight was 5300, and the content of components having a molecular weight of 1000 or less was 5% by the GPC area ratio.

Polysiloxanes described below were similarly synthesized.

Polysiloxane (1)

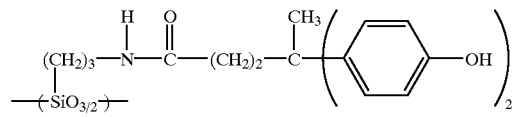

Polysiloxane (2)

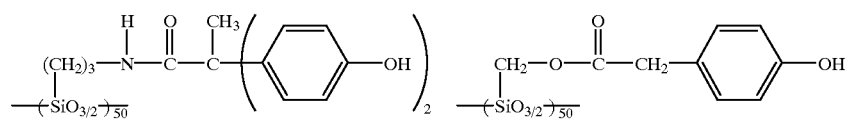

Polysiloxane (3)

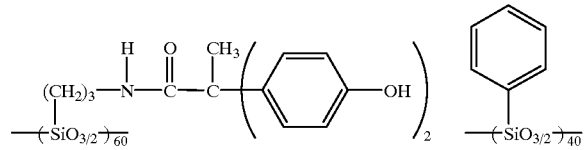

Polysiloxane (4)

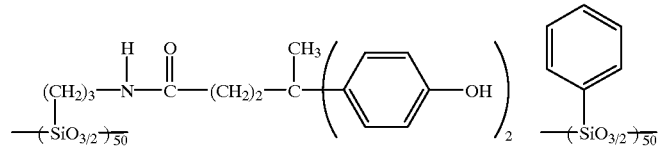

Polysiloxane (5)

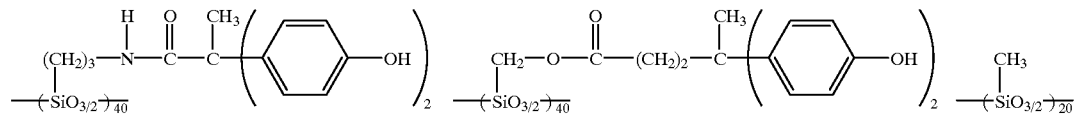

Polysiloxane (6)

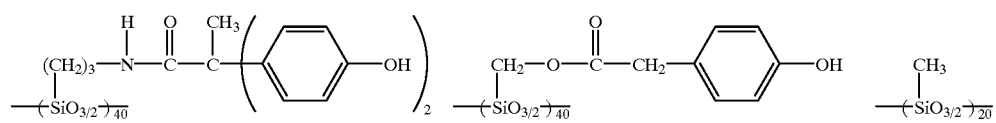

Polysiloxane (7)

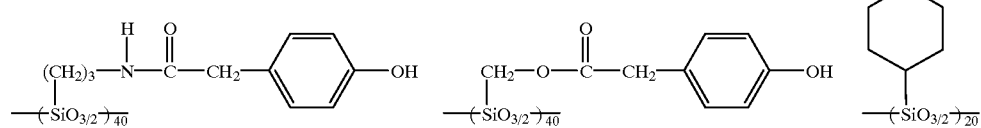

Example II-1

In 19.2 g of propylene glycol monomethyl ether acetate, 1.6 g of polysiloxane (1) as polysiloxane component (a), 0.12 g of triphenylsulfonium-2,4,6-triisopropylphenylsulfonate as acid generating agent component (b), 0.012 g of triphenylimidazol, and 0.48 g of compound example (60) (wherein R=CH$_2$COOC(CH$_3$)$_3$) as component (c) were dissolved, and a slight amount of Surflon S-382 was added thereto, followed by precision filtration through a 0.1 μm membrane filter.

An FHi-028D resist (a resist for i-rays, manufactured by Fuji Film Olin Co., Ltd.,) was applied onto a silicon wafer with a CDS-650 coater manufactured by Canon Inc., and baked at 90° C. for 90 seconds to obtain an uniform film having a thickness of 0.83 μm. This was further heated at 200° C. for 3 minutes. As a result, the thickness of the film was reduced to 0.71 μm. The silicon-containing resist prepared above was applied onto this film, and baked at 90° C. for 90 seconds to form a film having a thickness of 0.20 μm.

The wafer thus obtained was exposed using an FPA-3000EX3 KrF eximer laser stepper manufactured by Canon Inc., on which a resolution mask was mounted, while changing exposure and focus. Then, the wafer was heated in a clean room at 120° C. for 90 seconds, thereafter developed with a tetramethyl-ammonium hydroxide developing solution (2.38%) for 60 seconds, rinsed with distilled water, and dried to obtain a pattern. Observation under a scanning electron microscope showed that a line/space of 0.16 μm was resolved at a sensitivity of 22 mJ/cm$^2$. The rectangularity of the cross section was evaluated as B. The rectangularity of the cross section was compared by three-rank evaluation as follows. That is to say, the angle between a substrate and a side wall of the resist pattern was measured. When the angle was from 80° to 90°, the rectangularity was evaluated as A. When the angle was from 70° to less than 80°, the rectangularity was evaluated as B. When the angle was less than 70°, the rectangularity was evaluated as C. The above-described wafer was subjected to etching treatment by use of a parallel flat plate type reactive ion etching apparatus manufactured by ULVAC CO., LTD., using oxygen as an etching gas, at a pressure of 20 mTorr at an application power of 100 mW/cm$^2$ for 15 minutes, followed by observation under a scanning electron microscope. The dimension shift of the 0.15 μm pattern was 0.008 μm. Results of the evaluation are shown in Table II-2.

Examples II-2 to II-14

Positive type photoresists were prepared in the same manner as with Example II-1 with the exception that alkali-soluble polysiloxane component (a), component (b) and component (c) used in Example II-1 were each replaced by components (a), components (b) and components (c) described in Table II-1, respectively, and exposed, developed and etched in the same manner as with Example II-1. Properties of the resists thus obtained are shown in Table II-2.

TABLE II-1

| Example | Siloxane Component (a) | Component (c) Structure | Amount Added | Acid Generating Agent Component (b) |
|---|---|---|---|---|
| II-1 | (1) Mw = 4300 | (18) R=CH$_2$CO$_2$C(CH$_3$)$_3$ | 30 | Triphenylsulfonium 2,4,6-triisopropyl-phenylsulfonate |
| II-2 | (1) Mw = 4300 | (60) R=CH$_2$CO$_2$C(CH$_3$)$_3$ | 25 | Triphenylsulfonium 2,4,6-trimethyl-phenylsulfonate |

TABLE II-1-continued

| Example | Siloxane Component (a) | Component (c) Structure | Amount Added | Acid Generating Agent Component (b) |
|---|---|---|---|---|
| II-3 | (2) Mw = 5300 | (60) R=CH$_2$CO$_2$C(CH$_3$)$_3$ | 25 | Triphenylsulfonium 2,4,6-triisopropyl-phenylsulfonate |
| II-4 | (2) Mw = 5300 | (60) R=CH$_2$CO$_2$C(CH$_3$)$_3$ | 30 | Triphenylsulfonium 2,4,6-trimethyl-phenylsulfonate |
| II-5 | (3) Mw = 7100 | (60) R=CH$_2$CO$_2$C(CH$_3$)$_3$ | 25 | Triphenylsulfonium pentafluorophenyl-sulfonate |
| II-6 | (3) Mw = 7100 | (70) | 25 | Diphenyliodonium 2,4,6-triisopropyl-phenylsulfonate |
| II-7 | (4) Mw = 3900 | (18) R=CH$_2$CO$_2$C(CH$_3$)$_3$ | 30 | Triphenylsulfonium pentafluorophenyl-sulfonate |
| II-8 | (4) Mw = 3900 | (18) R=CH$_2$CO$_2$C(CH$_3$)$_3$ | 25 | Triphenylsulfonium 2,4,6-trimethyl-phenylsulfonate |
| II-9 | (5) Mw = 4300 | (60) R=CH$_2$CO$_2$C(CH$_3$)$_3$ | 25 | Triphenylsulfonium pentafluorophenyl-tosylate |
| II-10 | (5) Mw = 4800 | (60) R=CH$_2$CO$_2$C(CH$_3$)$_3$ | 30 | Triphenylsulfonium 2,4,6-triisopropyl-phenylsulfonate |
| II-11 | (6) Mw = 6400 | (60) R=CH$_2$CO$_2$C(CH$_3$)$_3$ | 25 | Triphenylsulfonium pentafluorophenyl-sulfonate |
| II-12 | (6) Mw = 6400 | (18) R=CH$_2$CO$_2$C(CH$_3$)$_3$ | 25 | Triphenylsulfonium pentafluorophenyl-tosylate |
| II-13 | (7) Mw = 3800 | (70) | 25 | Triphenylsulfonium pentafluorophenyl-tosylate |
| II-14 | (7) Mw = 3800 | (70) | 25 | Triphenylsulfonium 2,4,6-triisopropyl-phenylsulfonate |

The amount of component (c) added was indicated by percent by weight based on component (a).

TABLE II-2

| Example | Resolution Mm | Sensitivity mJ/cm$^2$ | Rectangularity, SEM Observation | Dimension Shift After Etching μm |
|---|---|---|---|---|
| II-1 | 0.16 | 22 | B | 0.008 |
| II-2 | 0.16 | 25 | A | 0.007 |
| II-3 | 0.17 | 23 | A | 0.009 |
| II-4 | 0.16 | 26 | B | 0.007 |
| II-5 | 0.16 | 27 | A | 0.009 |
| II-6 | 0.17 | 25 | A | 0.010 |
| II-7 | 0.16 | 26 | B | 0.009 |
| II-8 | 0.16 | 23 | A | 0.010 |
| II-9 | 0.17 | 26 | A | 0.007 |
| II-10 | 0.16 | 23 | B | 0.009 |
| II-11 | 0.16 | 22 | A | 0.010 |
| II-12 | 0.17 | 26 | A | 0.007 |
| II-13 | 0.16 | 25 | A | 0.009 |
| II-14 | 0.16 | 25 | A | 0.009 |

The numbers designated in parentheses in the column of "Component (a)" in Table II-1 indicate numbers designating the respective specific examples of the polysiloxanes shown in Synthesis Example II-2 and later. The numbers designated in parentheses in the column of "Component (c), Structure" indicate numbers designating the respective specific examples of components (c) described above. R represents a protecting group for protecting a phenolic group in the structural formula of each specific example.

Comparative Example II-1

A positive type photoresist was prepared in the same manner as with Example II-1 with the exception that the polysiloxane used in Example II-1 was replaced by polysiloxane (D-1) described below, and exposed, developed and etched in the same manner as with Example II-1, followed by observation under a scanning electron microscope in the same manner as with Example II-1. Results thereof are shown in Table II-3.

Comparative Example II-2

A positive type photoresist was prepared in the same manner as with Example II-1 with the exception that the polysiloxane used in Example II-1 was replaced by polysiloxane (D-2) described below, and exposed, developed and etched in the same manner as with Example II-1, followed by observation under a scanning electron microscope in the same manner as with Example II-1. Results thereof are shown in Table II-3.

Compounds Used in Comparative Examples

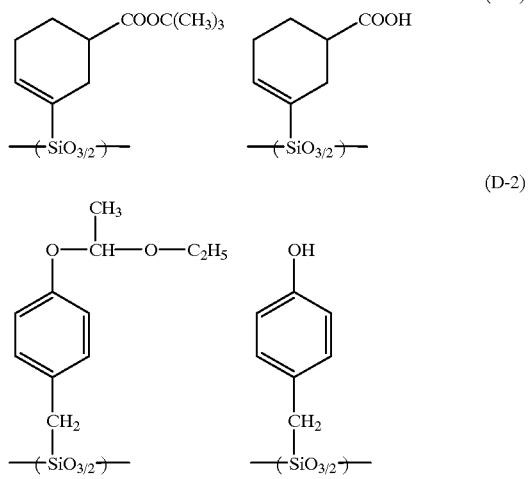

TABLE II-3

| Comparative Example | Resolution Mm | Sensitivity mJ/cm$^2$ | Rectangularity, SEM Observation | Dimension Shift After Etching μm |
|---|---|---|---|---|
| II-1 | 0.21 | 38 | B | 0.016 |
| II-2 | 0.19 | 32 | C | 0.012 |

From the results shown in Tables II-1 to II-3, the following are apparent.

The positive type photoresist compositions of the present invention in which the polysiloxanes of the present invention are used give resists having high resolution, good rectangularity and decreased dimension shift of pattern, and these characteristics are well balanced.

On the other hand, in the case of Comparative Examples II-1 and II-2 in which the polysiloxanes of the present invention are not used, the above-described characteristics are poorly balanced.

The positive type photoresist compositions of the present invention in which the polysiloxanes of the present invention are used give resists having high sensitivity, high resolution and rectangularity. Further, when the positive type photoresist compositions of the present invention are used as upper-layer resists in the two-layer resist system, fine patterns decreased in dimension shift and high in aspect ratio can be formed in pattern transfer to the lower layers using the oxygen plasma etching process.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising an alkali-soluble or acid-decomposable polysiloxane containing repeating structural units represented by formula (I):

(I)

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

or a group represented by

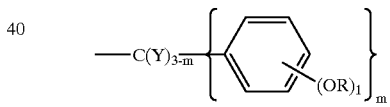

wherein Y represents a hydrogen atom, an alkyl group, an aryl group or an aralkyl group, an atomic group represented by Y may be straight-chain, branched or cyclic, R represents a hydrogen atom or an acid-decomposable group, l represents an integer of from 1 to 3, and m also represents an integer of from 1 to 3.

2. The positive photoresist composition as in claim 1, which comprises an alkali-soluble or acid-decomposable polysiloxane further containing repeating structural units represented by formula (II) together with the units represented by formula (I):

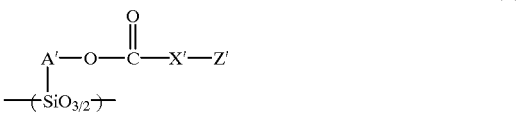

(II)

wherein A', X' and Z' each has the same meaning as given for each of A, X and Z in formula (I).

3. The positive photoresist composition as in claim 2, which comprises an alkali-soluble polysiloxane wherein R contained in the group represented by Z' in formula (II) is a hydrogen atom.

4. The positive photoresist composition as in claim 2, wherein A' is —$(CH_2)_n$— in formula (II).

5. The positive photoresist composition as in claim 1, which comprises an alkali-soluble polysiloxane wherein R contained in the group represented by Z in formula (I) is a hydrogen atom.

6. The positive photoresist composition as in claim 5, which further contains a phenolic compound in which at least a part of phenolic hydroxyl groups contained in a molecule are partially or completely protected by acid-decomposable groups.

7. The positive photoresist composition as in claim 5, which further contains an aromatic or aliphatic carboxylic acid compound in which at least a part of carboxyl groups contained in a molecule are partially or completely protected by acid-decomposable groups.

8. The positive photoresist composition as in claim 1, wherein L is —$(CH_2)_3$—NHCO— in formula (I).

9. A positive photoresist composition comprising the following (a), (b), (c) and (d):

(a) an alkali-soluble or acid-decomposable polysiloxane containing repeating structural units represented by formula (I):

$$\begin{array}{c} L\text{---}X\text{---}Z \\ | \\ \text{---}(SiO_{3/2})\text{---} \end{array} \quad (I)$$

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

[structure with (OR)$_1$]

or a group represented by

—C(Y)$_{3-m}$[—phenyl—(OR)$_1$]$_m$ wherein Y represents a hydrogen atom, an alkyl group, an aryl group or an aralkyl group, an atomic group represented by Y may be straight-chain, branched or cyclic, R represents a hydrogen atom or an acid-decomposable group, l represents an integer of from 1 to 3, and m also represents an integer of from 1 to 3;

(b) a compound which is decomposed by exposure to generate an acid;

(c) (c1) a phenolic compound in which at least a part of phenolic hydroxyl groups contained in a molecule are partially or completely protected by acid-decomposable groups, or (c2) an aromatic or aliphatic carboxylic acid compound in which at least a part of carboxyl groups contained in a molecule are partially or completely protected by acid-decomposable groups; and (d) a solvent which can dissolve all of the above (a), (b) and (c).

10. The positive photoresist composition as in claim 9, which comprises an alkali-soluble or acid-decomposable polysiloxane further containing repeating structural units represented by formula (II) together with the units represented by formula (I):

$$\begin{array}{c} A'\text{---}O\text{---}\overset{\overset{\displaystyle O}{\|}}{C}\text{---}X'\text{---}Z' \\ | \\ \text{---}(SiO_{3/2})\text{---} \end{array} \quad (II)$$

wherein A', X' and Z' each has the same meaning as given for each of A, X and Z in formula (I).

11. The positive photoresist composition as in claim 10, wherein A' is —$(CH_2)_n$— in formula (II).

12. The positive type photoresist composition as in claim 9, wherein L is —$(CH_2)_3$—NHCO— in formula (I).

13. A positive photoresist composition comprising the following (a), (b) and (d):

(a) an alkali-soluble or acid-decomposable polysiloxane containing repeating structural units represented by formula (I):

$$\begin{array}{c} L\text{---}X\text{---}Z \\ | \\ \text{---}(SiO_{3/2})\text{---} \end{array} \quad (I)$$

wherein L represents at least one divalent connecting group selected from the group consisting of —A—NHCO—, —A—NHCOO— and —A—NHCONH—, wherein A represents a single bond, an alkylene group or an arylene group; X represents a single bond or a divalent connecting group; and Z represents either a group represented by

[structure with (OR)$_1$]

or a group represented by

—C(Y)$_{3-m}$[—phenyl—(OR)$_1$]$_m$ wherein Y represents a hydrogen atom, an alkyl group, an aryl group or an aralkyl group, an atomic group represented by Y may be straight-chain, branched or cyclic, R represents a hydrogen atom or an acid-decomposable group, provided that at least a part of repeating units in the polysiloxane is a repeating unit in which R is an acid-decomposable group, l represents an integer of from 1 to 3, and m also represents an integer of from 1 to 3;

(b) a compound which is decomposed by exposure to generate an acid; and (d) a solvent which can dissolve both of the above (a) and (b).

14. The positive photoresist composition as in claim 13, which comprises an acid-decomposable polysiloxane further containing repeating structural units represented by formula (II) together with the units represented by formula (I):

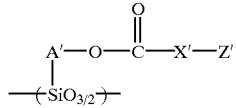

(II)

wherein A', X' and Z' each has the same meaning as given for each of A, X and Z in formula (I).

15. The positive photoresist composition as in claim 14, wherein A' is —$(CH_2)_n$— in formula (II).

16. The positive photoresist composition as in claim 13, wherein L is —$(CH_2)_3$—NHCO— in formula (I).

* * * * *